(12) United States Patent
Agano

(10) Patent No.: US 7,049,601 B2
(45) Date of Patent: May 23, 2006

(54) IMAGE READING METHOD AND IMAGE RECORDING AND READING DEVICE

(75) Inventor: Toshitaka Agano, Kaisei-machi (JP)

(73) Assignee: Fuji Photo Film Co., Ltd., Kanagawa-ken (JP)

(*) Notice: Subject to any disclaimer, the term of this patent is extended or adjusted under 35 U.S.C. 154(b) by 315 days.

(21) Appl. No.: 10/342,402

(22) Filed: Jan. 15, 2003

(65) Prior Publication Data
US 2003/0132391 A1  Jul. 17, 2003

(30) Foreign Application Priority Data
Jan. 16, 2002  (JP) ............... 2002-007160

(51) Int. Cl.
*G01T 1/24* (2006.01)

(52) U.S. Cl. .............. 250/370.09; 250/370.11; 250/362

(58) Field of Classification Search ........... 250/370.11, 250/370.01, 370.08, 370.09, 363.07, 362
See application file for complete search history.

(56) References Cited

U.S. PATENT DOCUMENTS

| | | |
|---|---|---|
| 4,678,938 A | 7/1987 | Nakamura |
| 4,803,359 A | 2/1989 | Hosoi et al. |
| 4,972,243 A | 11/1990 | Sugawa et al. |
| 5,623,306 A | 4/1997 | Kajihara et al. |
| 5,818,898 A * | 10/1998 | Tsukamoto et al. ........ 378/98.8 |
| 6,268,614 B1 | 7/2001 | Imai |
| 6,333,505 B1 | 12/2001 | Agano |
| 6,351,519 B1 * | 2/2002 | Bonk et al. ................. 378/98.8 |
| 6,376,857 B1 | 4/2002 | Imai |
| 6,453,008 B1 * | 9/2002 | Sakaguchi et al. ......... 378/98.7 |
| 6,600,160 B1 * | 7/2003 | Kobayashi et al. .... 250/370.14 |
| 6,854,885 B1 * | 2/2005 | Wischmann et al. ........ 378/207 |

FOREIGN PATENT DOCUMENTS

| | | |
|---|---|---|
| EP | 838859 A2 * | 4/1998 |
| JP | 1-216290 | 8/1989 |
| JP | 2-164067 | 6/1990 |
| JP | 7-72256 | 3/1995 |
| JP | 63-114253 A | 5/1998 |
| JP | 2000-174982 | 6/2000 |
| WO | WO 92/06501 | 4/1992 |

OTHER PUBLICATIONS

SPIE, vol. 1443 Medical Imaging V; Image Physics (1991), pp. 108-119.
"Materials Parameters in Thick Hydrogenated Amorphous Silicon Radiation Detectors", Lawrence Laboratory, University of California, Berkeley, CA 94720.

* cited by examiner

Primary Examiner—Albert Gagliardi
(74) Attorney, Agent, or Firm—Sughrue Mion, PLLC

(57) ABSTRACT

In a radiation image reading method for reading image signals corresponding to radiation image information from a radiation solid-state detector in which the radiation image information is recorded by irradiation of a recording electromagnetic wave, correction of an offset and a gain in the image signals, which are attributable to a dark current of the radiation solid-state detector, is performed more accurately and easily. A correction pixel region, in which a light-shielding member 6 is provided so as to be adjacent to respective read pixels, and a correcting means 25 corrects an image signal corresponding to the read pixel based on a correction region signal corresponding to the correction pixel region adjacent to the read pixel.

25 Claims, 15 Drawing Sheets

XY SECTION

XZ SECTION

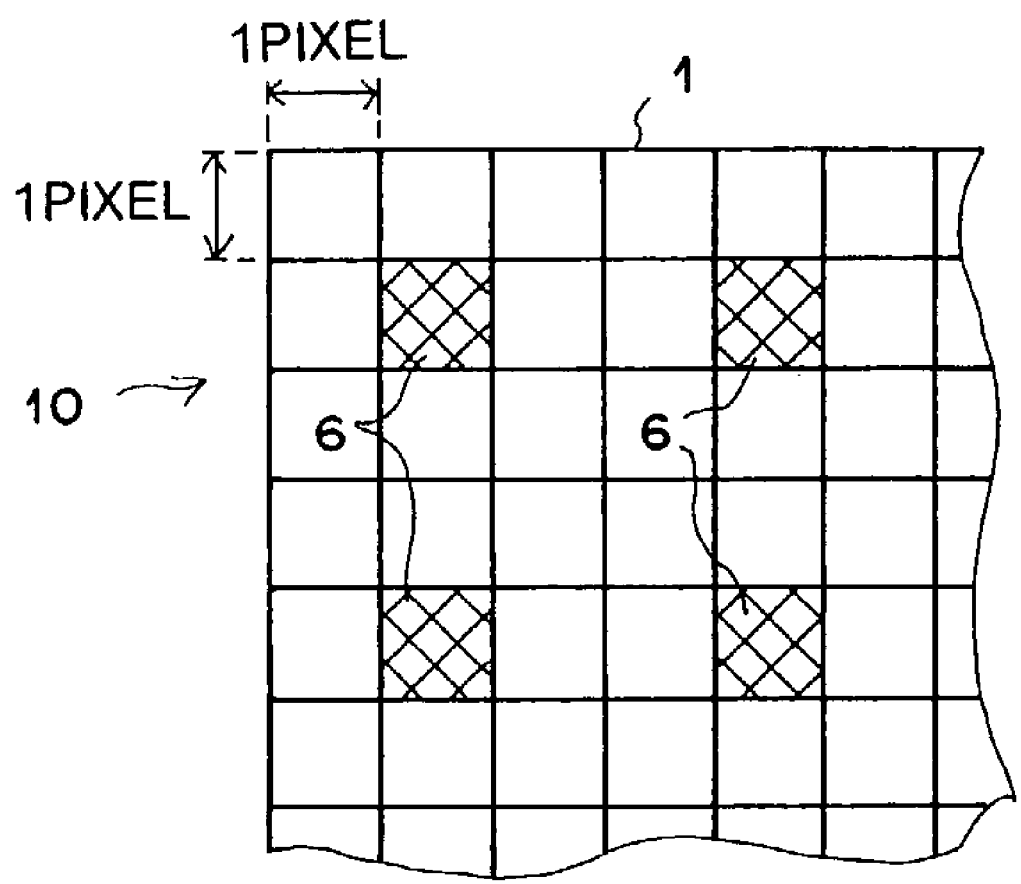

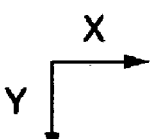

XY SECTION

XZ SECTION

IMAGE READING METHOD AND IMAGE RECORDING AND READING DEVICE

BACKGROUND OF THE INVENTION

1. Field of the Invention

The present invention relates to an image reading method for reading an image signal corresponding to image information from a solid-state detector in which the image information is recorded by irradiation of a recording electromagnetic wave, and to an image recording and reading device using the foregoing solid-state detector.

2. Description of the Related Art

Nowadays, in radiography for the purpose of medical diagnosis and the like, a radiation image recording and reading device is known, which uses a radiation solid-state detector for detecting radiation and outputting an image signal representing radiation image information. Various types of detectors are proposed and put to practical use as the detector used in the above device.

From the aspect of a charge generation process for converting radiation into electric charges, for example, there are radiation solid-state detectors of the following types, including: a radiation solid-state detector of a photoconversion type, which temporarily accumulates signal charges in a charge storage section of a photoelectric conversion element, converts the accumulated charges into an image signal (an electrical signal) and outputs the image signal, the signal charges being obtained by detecting fluorescence emitted from a phosphor upon exposure to radiation by the photoelectric conversion element (for example, U.S. Pat. No. 4,803,359 and Japanese Unexamined Patent Publication No. 2 (1990)-164067, PCT International Publication Number WO92/06501, SPIE Vol. 1443 Medical Imaging V; Image Physics (1991), pp. 108–119 and the like); a radiation solid-state detector of a direct conversion type, which temporarily accumulates signal charges in a charge storage section, converts the accumulated charges into an electrical signal and outputs the electrical signal, the signal charges being generated in a radiation conductor upon exposure to radiation and being collected by a charge collection electrode (MATERIAL PARAMETERS IN THICK HYDROGENATED AMORPHOUS SILICONRADIATION DETECTORS, Lawrence Berkeley L. University of California, Berkeley. Calif. 94720 Xerox Parc. Palo Alto. Calif. 94304, Metal/Amorphous Silicon Multilayer Radiation Detectors, IEE TRANSACTIONS ON NUCLEAR SCIENCE. VOL. 36, NO. 2, APRIL 1989, Japanese Unexamined Patent Publication No. 1 (1989)-216290, and the like); and the like.

Moreover, from the aspect of a charge read-out process for reading out the accumulated charges, there are radiation solid-state detectors of the following types, including: a radiation solid-state detector of a TFT read-out type, which reads out the accumulated charges by performing scan drive of a TFT (thin film transistor) connected to the charge storage section; a radiation solid-state detector of an optical read-out type, which reads out the accumulated charges by irradiating a reading light (reading electromagnetic waves) on the detector; and the like.

Furthermore, there have been proposed radiation solid-state detectors of an improved direct conversion type in U.S. Pat. Nos. 6,268,614 and 6,376,857. The radiation solid-state detector of the improved direct conversion type is one of the direct conversion type and the optical read-out type. The radiation solid-state detector of the improved direct conversion type is constituted by sequentially laminating the following layers, including: a first electrode layer having transmissivity to recording radiation; a photoconductive layer for recording (hereinafter referred to as a recording photoconductive layer), which shows photoconductivity (to be accurate, radioconductivity) by receiving irradiation of the recording radiation transmitted through the first electrode layer; a charge transfer layer acting as substantially an insulator on charges of the same polarity as charges in the first electrode layer and acting as substantially a conductor for charges of a polarity opposite to that of the foregoing charges; a photoconductive layer for reading (hereinafter referred to as a reading photoconductive layer), which shows photoconductivity (to be accurate, electromagnetic conductivity) upon receipt of irradiation of an electromagnetic wave for reading; and a second electrode layer having transmissivity to the electromagnetic wave for reading. In the radiation solid-state detector of the improved direct conversion type, signal charges (latent image charges) carrying image information are accumulated on an interface (a charge storage section) between the recording photoconductive layer and the charge transfer layer.

Moreover, in the optical read-out type including the above improved direct conversion type, as a method for reading out the signal charged accumulated in the charge storage section, there are three methods, including, for example; a method for detecting the signal charges in such a manner that the second electrode layer (hereinafter referred to as a read electrode), that is an electrode on a side where a reading light is irradiated, is set to have a flat-plate shape and the read electrode is scanned with a spot-shaped reading light such as a laser; a method for detecting the signal charges in such a manner that the read electrode is set as a stripe electrode composed of arrays of a number of linear electrodes, a direction substantially at right angle to a longitudinal direction of the stripe electrode, that is, a longitudinal direction of each linear electrode is set to be a main scanning direction, the longitudinal direction is set to be a sub-scanning direction, and scanning with the spot-shaped reading light is performed in the main scanning and sub-scanning directions; and a method for detecting the signal charges by scanning with a line light source in the longitudinal direction (that is, the sub-scanning direction) of the stripe electrode, the line light source extending in the main scanning direction.

Moreover, in the radiation solid-state detector as described above, in reading out the charges accumulated in the charge storage section, since the foregoing radiation solid-state detector utilizes a semiconductor, not only a current corresponding to an amount of the charges accumulated in the charge storage section but a dark current is read out. Due to this dark current, a stationary gain or offset is included in an image signal outputted from the radiation solid-state detector, and thus a reproduced image based on an accurate image signal cannot be obtained. In addition, there a problem arises in that deterioration in an image quality of the reproduced image is caused. Moreover, in some cases, the dark current changes in accordance with temperature or changes over time. In order to avoid the above problems, there has been proposed a method for correcting the foregoing offset and gain by subtracting an image signal read out from a radiation solid-state detector with no radiation image information recorded therein from an image signal read out from a radiation solid-state detector with radiation image information recorded therein in Japanese Unexamined Patent Publication No. 7(1995)-072256. However, in this case, it is necessary to read the radiation solid-state detector with no radiation image information recorded therein, thus taking time and trouble. Moreover, a method for correcting the foregoing offset and gain without reading the radiation detector with no radiation image information recorded therein as described above has been proposed in Japanese Unexamined Patent Publication No. 2000-174982 and U.S. Pat. No. 6,333,505. Specifically, the above method is realized in such a manner that an insensitive pixel detecting no radiation is provided and the foregoing offset and gain are corrected by using a pixel signal corresponding to this insensitive pixel.

However, in Japanese Unexamined Patent Publication Nos. 2000-174982 and 2000-224377, the insensitive pixel is provided in a region other than a region where the radiation image information in the radiation solid-state detector is recorded, or is provided in an edge of the radiation solid-state detector. Thus, when the insensitive pixel is away from pixels in which the radiation image information is recorded, it is highly unlikely that the same dark current flows between these pixels. Therefore, accurate correction of the foregoing offset and gain was difficult to perform.

SUMMARY OF THE INVENTION

In consideration for the above-described problems, an object of the present invention is to provide an image reading method and an image recording and reading device, which can accurately and easily perform correction of offset and gain in an image signal attributable to a dark current of a solid-state detector.

A first image reading method of the present invention is an image reading method, in which a solid-state detector for recording image information by accumulating charges generated by irradiation of a recording electromagnetic wave carrying the image information is used, an image signal corresponding to the image information is read for every pixel from the solid-state detector with the image information recorded therein by the irradiation of the recording electromagnetic wave, and the image signal is corrected based on a correction region signal read from a correction region where the incidence of the recording electromagnetic wave in the solid-state detector is suppressed. In the image reading method, the correction region is set as a correction pixel region formed in units of pixels, a plurality of the correction pixel regions are provided so as to be dispersed and distributed in an area where the recording electromagnetic wave is irradiated, and each image signal read from a read pixel positioned in a region other than the correction pixel regions is corrected based on a correction region signal read from the correction pixel region located in the vicinity of each read pixel.

Herein, the foregoing "recording electromagnetic wave" means, for example, radiation and the like. However, the recording electromagnetic wave includes fluorescence and the like emitted from a phosphor and the like by exposure to radiation carrying the radiation image information.

Moreover, the foregoing "the incidence of the recording electromagnetic wave is suppressed" may be achieved in the following manners. For example, the incidence of radiation on the solid-state detector may be suppressed by providing a light-shielding member of Cr, Pb, W or the like and absorbing the radiation. Alternatively, the incidence of fluorescence on the solid-state detector may be suppressed by providing a light-shielding member containing a dye, a pigment or the like and absorbing the fluorescence. Moreover, the incidence of radiation on the solid-state detector may be suppressed by controlling intensity of the radiation itself.

The foregoing "the correction region is set as the correction pixel region formed in units of pixels" means that the correction region is constituted by pixel units.

The foregoing "the correction pixel region located in the vicinity of each read pixel" is desirably a correction pixel region located closest to each read pixel.

A second image reading method of the present invention is an image reading method, in which a solid-state detector for recording image information by accumulating charges generated by irradiation of a recording electromagnetic wave carrying the image information is used, an image signal corresponding to the image information is read for every pixel from the solid-state detector with the image information recorded therein by the irradiation of the recording electromagnetic wave, and the image signal is corrected based on a correction region signal read from a correction region where the incidence of the recording electromagnetic wave in the solid-state detector is suppressed. In the image reading method, the pixel in the solid-state detector is divided into the correction region and a read region other than the correction region, the image signal is generated from a read region signal read from the read region, and the generated image signal is corrected by use of a correction region signal read from a correction region located in the same pixel as that of the read region.

Herein, the foregoing "the pixel in the solid-state detector is divided into the correction region and the read region other than the correction region" means that a region of one pixel in the solid-state detector is divided into the foregoing correction region and the foregoing read region and that the read region signal and the correction region signal can be read from the respective regions. For example, in the case of a mode of reading an image signal by stripe electrodes, it is satisfactory that the region of one pixel in the solid-state detector is read by two stripe electrodes, the correction region signal corresponding to the correction region is read by one of the stripe electrodes and the read region signal corresponding to the read region is read by the other stripe electrode.

Moreover, the foregoing "read region" may be further divided into multiple regions. In such a case, the read region signal corresponding to the read region may be calculated based on signals corresponding to the multiple regions obtained by dividing the read region. For example, in the case of a mode that reads an image signal by TFTs, it is satisfactory that three TFTs corresponding to an R region, a G region and a B region are configured in a region of one pixel by use of an exposure mask for a color liquid crystal panel, two of the TFTs read the read region signal corresponding to the read region and the remaining one TFT reads the correction region signal corresponding to the correction region. In such a case, the read region signal may be calculated from signals read from the two TFTs as described above.

A first image recording and reading device of the present invention is an image recording and reading device including: a solid-state detector for recording image information by accumulating charges generated by irradiation of a recording electromagnetic wave carrying the image information; a reading means for reading an image signal for every pixel, the image signal corresponding to the image information recorded in the solid-state detector, and for reading a correction region signal from a correction region where the incidence of the recording electromagnetic wave in the solid-state detector is suppressed; and a correcting means for correcting the image signal based on the correction region signal. In the image recording and reading device, the correction region is a correction pixel region formed in units of pixels, a plurality of the correction pixel regions are provided so as to be dispersed and distributed in an area where the recording electromagnetic wave is irradiated, and the correcting means corrects respective image signals read from read pixels positioned in a region other than the correction pixel regions based on the correction region signal read from the correction pixel region located in the vicinity of each read pixel.

In the foregoing first image recording and reading device, the correction pixel regions are provided so as to be adjacent to the respective read pixels, and the correcting means can correct the respective image signals read from the read pixels based on the correction region signals read from the correction pixel regions adjacent to the respective read pixels.

Herein, the foregoing "being adjacent" includes not only those being adjacent in directions of right and left or up and down but also those being adjacent at their corners in an oblique direction. Therefore, it is assumed that up to eight read pixels are adjacent to one correction pixel.

Moreover, it is possible to allow the correcting means to calculate the image signal of the correction pixel region based on the image signal read from the read pixel positioned in the vicinity of the correction pixel region.

Herein, the image signal corresponding to the read pixel used in the calculation of the image signal of the foregoing correction pixel region is desirably an image signal after the correction based on the correction region signal. However, the image signal may be an image signal before the correction.

A second image recording and reading device of the present invention is an image recording and reading device including: a solid-state detector for recording image information by accumulating charges generated by irradiation of a recording electromagnetic wave carrying the image information; a reading means for reading an image signal for every pixel, the image signal corresponding to the image information recorded in the solid-state detector, and for reading a correction region signal from a correction region where the incidence of the recording electromagnetic wave in the solid-state detector is suppressed; and a correcting means for correcting the image signal based on the correction region signal. In the image recording and reading device, a pixel in the solid-state detector is divided into the correction region and a read region other than the correction region, the reading means generates an image signal from a read region signal read from the read region, and the correcting means corrects the foregoing generated image signal by use of the correction region signal read from the correction region located in the same pixel as that of the read region.

Moreover, in the foregoing second image recording and reading device, a condensing lens can be included, which condenses the recording electromagnetic wave in the read region.

A third image recording and reading device of the present invention includes: a solid-state detector for recording image information by accumulating charges generated by irradiation of a recording electromagnetic wave carrying the image information, in which a plurality of correction pixel regions provided so as to be dispersed and distributed in an area where the recording electromagnetic wave is irradiated and read pixel regions provided in regions other than the correction pixel regions are two-dimensionally arranged in pixel units, the correction pixel regions having incidence of the recording electromagnetic wave thereto suppressed; a reading means for reading charges generated in the correction pixel region of the solid-state detector as a correction pixel signal and for reading charges generated in the read pixel region thereof as a read pixel signal; and a correcting means for correcting the read pixel signal read by the reading means by use of a correction pixel signal corresponding to a correction pixel region located in the vicinity of the read pixel region corresponding to the read pixel signal and for outputting the corrected read pixel signal as an image signal corresponding to the image information.

In the foregoing third image recording and reading device, the correction pixel regions can be constituted by providing light-shielding members in the area where the recording electromagnetic wave is irradiated.

The solid-state detector has a phosphor layer that emits fluorescence upon irradiation of the recording electromagnetic wave and generates charges in accordance with the fluorescence emitted from the phosphor layer. Moreover, the correction pixel region in the solid-state detector is made by allowing the phosphor layer to be formed with a pigment or a dye that absorbs fluorescence.

The reading means can be composed of: a linearly extending light source; a scanning mechanism for scanning the line light source in a direction substantially orthogonal to a longitudinal direction of the line light source; and a stripe electrode composed of a plurality of linear electrodes extending linearly, which are arranged in the foregoing longitudinal direction for every pixel and takes the charges generated in the correction pixel region as the correction pixel signal and the charges generated in the read pixel region as the read pixel signal when the line light source is scanned in the direction substantially orthogonal to the longitudinal direction thereof by the scanning mechanism.

Moreover, the reading means can be composed of: a first stripe electrode having a plurality of first linear electrodes extending linearly, which are arranged for each pixel in a direction substantially orthogonal to a longitudinal direction of the linear electrodes; a second stripe electrode having a plurality of second linear electrodes extending linearly, which are arranged for each pixel in the foregoing longitudinal direction, the second stripe electrode being provided opposite to the first stripe electrode so as to sandwich the solid-state detector therebetween; and a signal detection amplifier for reading the read pixel signal and the correction pixel signal by connecting the first and second linear electrodes to each other.

Moreover, the reading means can be composed of: TFT switches provided for each pixel, for taking the charges generated in the correction pixel region as the correction pixel signal and the charges generated in the read pixel region as the read pixel signal; and a control unit for controlling the TFT switches.

The correcting means can be constituted to perform correction of the read pixel signal by calculating the following equation (1).

$$D = (Dn - Dd) \times 3/2 \qquad (1)$$

Where $Dn$: read pixel signal $Dd$: correction pixel signal

A fourth image recording and reading device of the present invention includes: a solid-state detector for recording image information by accumulating charges generated by irradiation of a recording electromagnetic wave carrying the image information, in which pixels are arranged two-dimensionally, each of which is composed of a correction pixel region and a read pixel region other than the correction pixel region, the correction pixel region having incidence of the recording electromagnetic wave thereto suppressed; a reading means for reading charges generated in the correction pixel region as a correction pixel signal and for reading charges generated in the read pixel region as a read pixel signal; and a correcting means for correcting the read pixel signal by use of a correction pixel signal corresponding to a correction pixel region located in the vicinity of the read pixel region corresponding to the read pixel signal and for outputting the corrected read pixel signal as an image signal corresponding to the image information.

In the foregoing forth image recording and reading device, the correction pixel regions can be constituted by providing light-shielding members in the area where the recording electromagnetic wave is irradiated.

The solid-state detector has a phosphor layer that emits fluorescence upon irradiation of the recording electromagnetic wave and generates charges in accordance with the fluorescence emitted from the phosphor layer. Moreover, the correction pixel region in the solid-state detector is made by allowing the phosphor layer to be formed with a pigment or a dye that absorbs fluorescence.

The reading means can be composed of: a linearly extending light source; a scanning mechanism for scanning the line light source in a direction substantially orthogonal to a longitudinal direction of the line light source; and a stripe electrode composed of a plurality of linear electrodes extending linearly, which are arranged in the foregoing longitudinal direction for every pixel and takes the charges generated in the correction pixel region as the correction pixel signal and the charges generated in the read pixel region as the read pixel signal when the line light source is scanned in a substantially orthogonal direction by the scanning mechanism.

Furthermore, the reading means can be composed of: TFT switches provided for every correction pixel region and read pixel region, for taking the charges generated in the correction pixel region as the correction pixel signal and the charges generated in the read pixel region as the read pixel signal; and a control unit for controlling the TFT switches.

Moreover, the correction pixel regions can be provided linearly for every column of pixels, and the reading means can be composed of: a first stripe electrode having a plurality of first linear electrodes extending linearly, which are arranged for each pixel in a direction substantially orthogonal to a longitudinal direction of the linear electrodes; a second stripe electrode having a plurality of second linear electrodes extending linearly, which are arranged for every correction pixel region and read pixel region in the foregoing longitudinal direction, the second stripe electrode being provided opposite to the first stripe electrode so as to sandwich the solid-state detector therebetween; and a signal detection amplifier for reading the read pixel signal and the correction pixel signal by connecting the first and second linear electrodes to each other.

Moreover, the correcting means can be composed of a difference amplifier for outputting the image signal based on the difference between a correction pixel signal and a read pixel signal, which are outputted from the signal detection amplifier.

The correcting means can be constituted to perform correction of the read pixel signal by calculating the following equation (1).

$$D = (Dn - Dd) \times 3/2 \quad (1)$$

Where $Dn$: read pixel signal $Dd$: correction pixel signal

According to the first image reading method of the present invention and the first and third image recording and reading devices of the present invention, the correction region is set as the correction pixel region formed in units of pixels, a plurality of the correction pixel regions are provided so as to be dispersed and distributed in the area where the recording electromagnetic wave is irradiated, and the respective image signals read from the read pixels positioned in the region other than the correction pixel regions are corrected based on the correction region signals read from the correction pixel regions located in the vicinity of the respective read pixels. Thus, the offset, gain and the like attributable to the dark current can be corrected more accurately and easily.

Moreover, in the foregoing first image reading method and the first and third image recording and reading devices, when the correction pixel region is provided so as to be adjacent to each read pixel and the correcting means corrects each image signal read from the read pixel based on the correction region signal read from the correction pixel region adjacent to each read pixel, the read pixel and the correction pixel exist in positions closer to each other, thus enabling more accurate correction.

Moreover, when the correcting means calculates the image signal of the correction pixel region based on the image signal read from the read pixel positioned in the vicinity of the correction pixel region, an appropriate image signal is calculated for the correction pixel region, thus enabling deterioration of an image quality due to the provision of the correction pixel region to be suppressed.

According to the second image reading method of the present invention and the second and fourth image recording and reading devices of the present invention, the pixel in the solid-state detector is divided into the correction region and the read region other than the correction region, the image signal is generated from the read region signal read from the read region, and the generated image signal is corrected by use of the correction region signal read from the correction region located in the same pixel as that of the read region. Thus, the offset, gain and the like attributable to the dark current can be corrected more accurately and easily.

Moreover, in the foregoing second and fourth image recording and reading devices, when the recording electromagnetic wave is condensed in the read region by use of the condensing lens, the deterioration of the image quality due to the provision of the correction region can be suppressed.

BRIEF DESCRIPTION OF THE DRAWINGS

FIG. 2 is a plan view of the radiation solid-state detector shown in FIG. 1A.

FIG. 6 is a view explaining image signals read out by the radiation image recording and reading device shown in FIG. 3A.

DESCRIPTION OF THE PREFERRED EMBODIMENTS

Figure 1A:
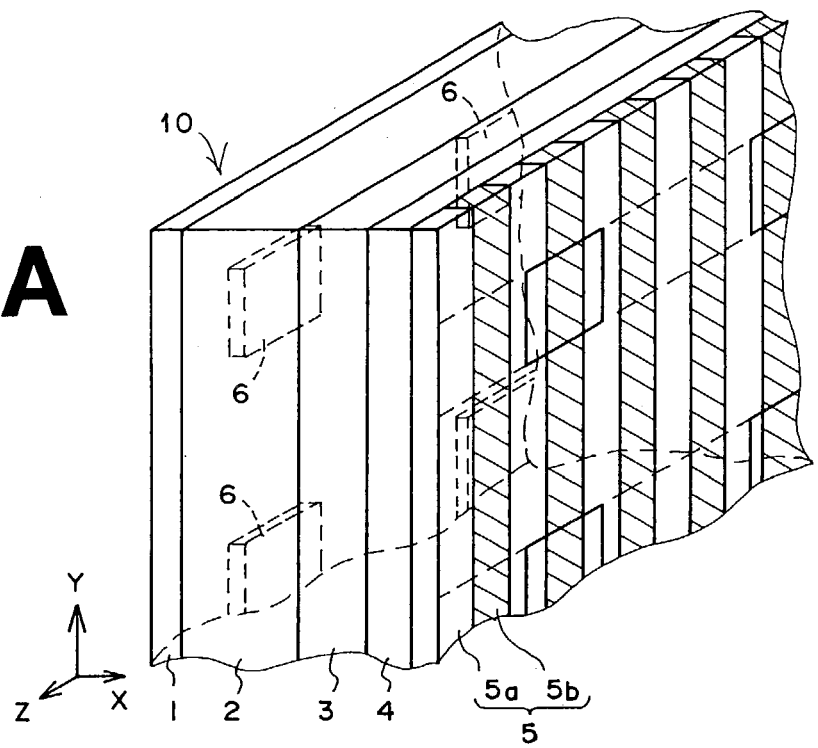
FIG. 1A is a perspective view of a radiation solid-state detector used in a radiation image recording and reading device to which a first embodiment of an image recording and reading device according to the present invention is applied.
Figure 1B:
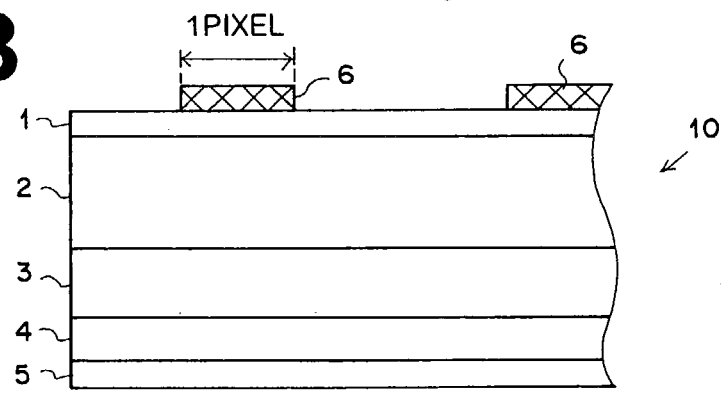
FIG. 1B is an X-Y section view of FIG. 1A.
Figure 1C:
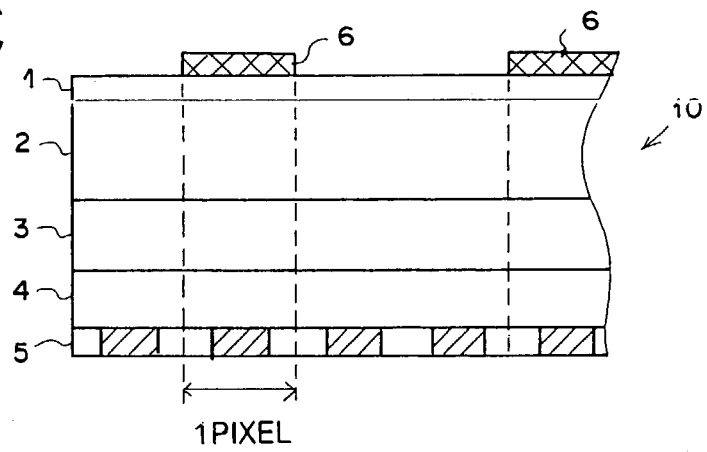
FIG. 1C is an X-Z section view of FIG. 1A.

Embodiments of the present invention will be described in detail below with reference to the accompanying drawings. FIGS. 1A through 1C are schematic views of a radiation solid-state detector used in an image recording and reading device implementing an image reading method according to the present invention. FIG. 1A is a perspective view thereof, FIG. 1B is an X-Y section view of the detector and FIG. 1C is an X-Z section view thereof.

A radiation solid-state detector 10 records radiation image information as a static latent image and generates a current corresponding to the foregoing static latent image by being scanned with a reading electromagnetic wave (hereinafter referred to as a reading light). Specifically, the radiation solid-state detector 10 is constituted by sequentially laminating the following layers, including: a first electrode layer 1 having transmissivity to recording radiation (for example, X rays and the like, hereinafter referred to as a recording light); a recording photoconductive layer 2 that exhibits conductivity upon receipt of irradiation of the recording light; a charge transfer layer 3 acting substantially as an insulator for charges (for example, negative charges) in the first electrode layer 1 and acting substantially as a conductor for charges (positive charges in the above-described example) of a polarity opposite to that of the foregoing charges; a reading photoconductive layer 4 that exhibits conductivity upon receipt of irradiation of the reading light; and a second electrode layer 5 having transmissivity to the reading light.

Herein, in the foregoing radiation solid-state detector 10, as shown in FIGS. 1A to 1C, light-shielding members 6 for suppressing incidence of the recording light on the first electrode layer 1 are provided on the upper surface of the first electrode layer 1. Each of the light-shielding members 6 has a size of one pixel as shown in FIGS. 1B and 1C, and a pixel having this light-shielding member 6 is called a correction pixel region. As shown in FIG. 2, each correction pixel region is provided so as to be adjacent to pixels (hereinafter referred to as read pixels) having no light-shielding member 6 on a periphery thereof. Specifically, in this embodiment, the correction pixel regions are evenly provided all over the first electrode layer 1 in a proportion of one pixel in nine. As the light-shielding member 6, it is desirable to use a member that suppresses the incidence of the recording light by absorbing the recording light. For example, a member containing Cr, Pb, W or the like can be utilized.

Moreover, the second electrode layer 5 is composed of numerous linear electrodes (shaded areas in the drawing), which are arranged in a stripe manner. A substance located in the space 5b between elements 5a which are the respective linear electrodes should shield the reading light.

Figure 3A:
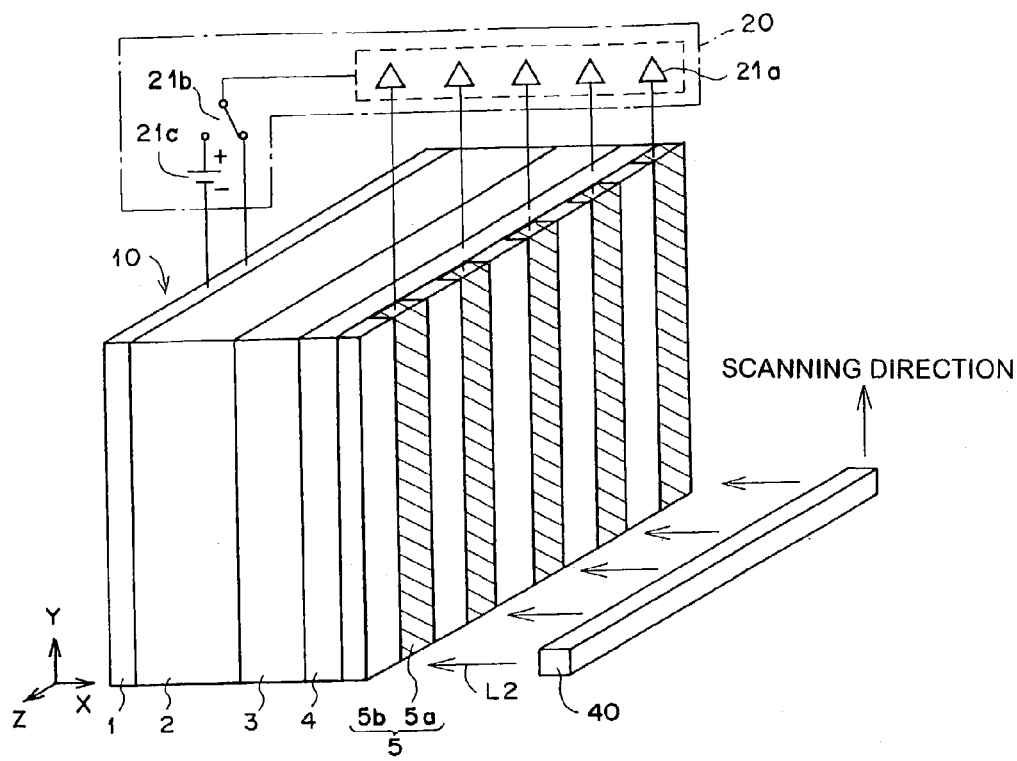
FIGS. 3A and 3B are schematic configuration views of the radiation image recording and reading device using the first embodiment of the image recording and reading device according to the present invention.
Figure 3B:
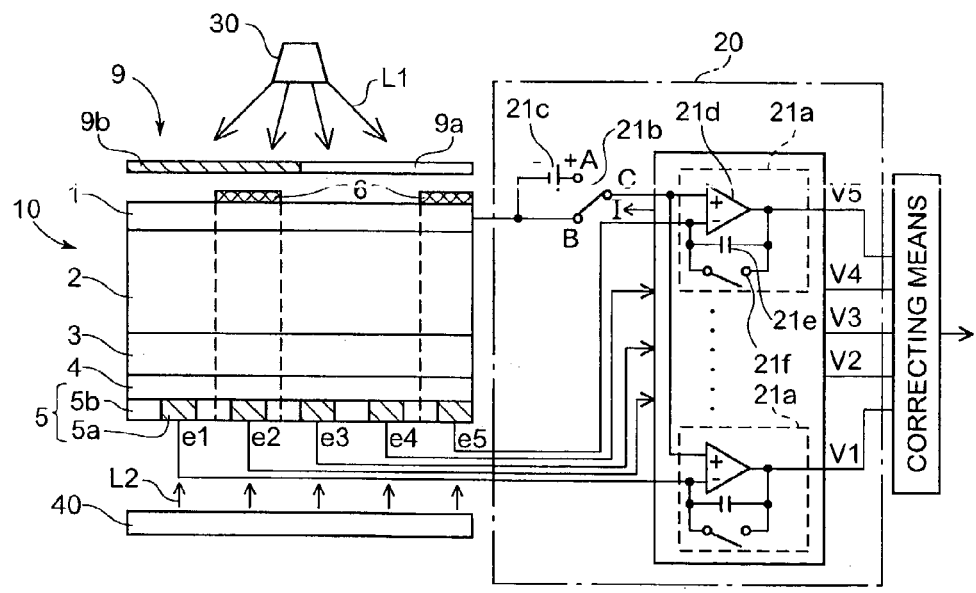

Next, description will be made in detail for a method for recording the radiation image information in the foregoing radiation solid-state detector 10 and for a method for reading the recorded radiation image information. FIGS. 3A and 3B are schematic constitutional views of a radiation image recording and reading device using the radiation solid-state detector 10 shown in FIG. 1A.

The radiation image recording and reading device of the present invention is constituted by: the radiation solid-state detector 10; current detection means 20; correcting means 25; recording light irradiation means 30; and reading light irradiation means 40. The recording light irradiation means 30 uniformly exposes a subject 9 to a recording light L1. The reading light irradiation means 40 performs scanning exposure in a longitudinal direction (the direction indicated by an arrow in the drawing) of the elements 5a while irradiating a substantially uniform linear reading light L2 in a direction substantially orthogonal to the elements 5a of the second electrode layer 5.

The current detection means 20 has a number of current detection amplifiers 21a connected to the respective elements 5a of the second electrode layer 5 and detects currents flowing in the respective elements 5a by exposure of the reading light L2 on every element 5a. The first electrode layer 1 of the radiation solid-state detector 10 is connected to a B terminal of connection means 21b and to a negative pole of a power source 21c. A positive pole of the power source 21c is connected to an A terminal of the connection means 21b. A C terminal of the connection means 21b is connected to the respective current detection amplifiers 21a (FIG. 3B).

By use of correction region signals corresponding to the correction pixel regions provided as described above, the correcting means 25 corrects image signals of the read pixels other than the correction pixel regions.

Subject 9 is disposed above the electrode layer 1. Subject 9 consists of a transmission portion 9a through which the recording light L1 is transmitted and a light-shielding portion 9b through which no recording light is transmitted.

Figure 4A:
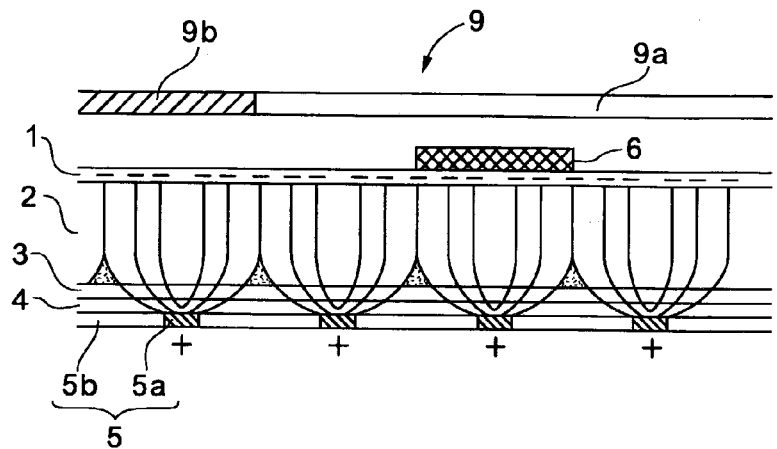
FIGS. 4A, 4B, and 4C are views explaining a method for recording radiation image information by use of the radiation image recording and reading device shown in FIG. 3A.

First, a DC voltage is applied between the first electrode layer 1 and the elements 5a of the second electrode layer, thus charging both the electrode layers. Accordingly, as shown in FIG. 4A, U-shaped electric fields are formed between the first electrode layer 1 and the elements 5a.

Figure 4B:
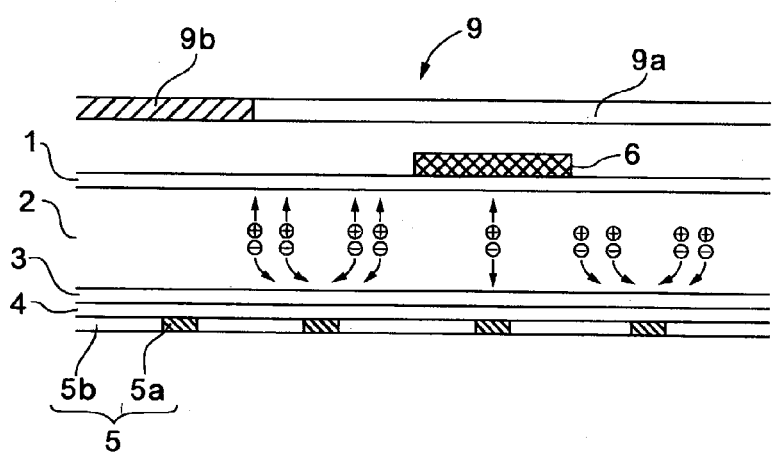
Figure 4C:
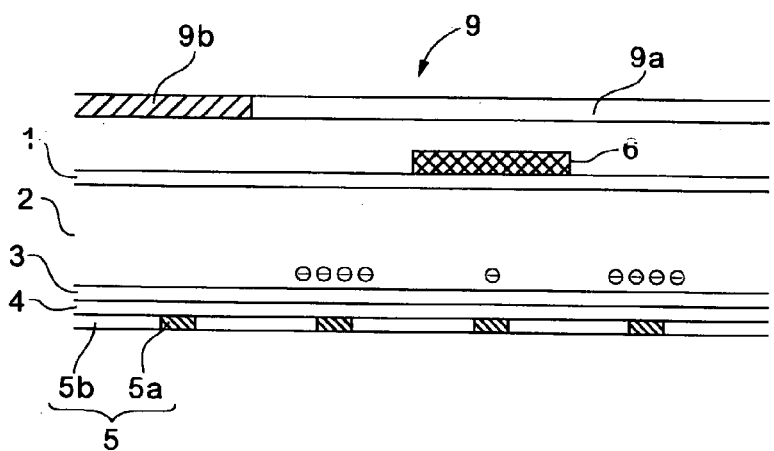

Next, uniform exposure of the recording light L1 is performed from the recording light irradiation means 30 toward the subject 9. The recording light L1 is transmitted through the transmission portion 9a of the subject 9 and is also transmitted through the first electrode layer 1. The recording photoconductive layer 2 receives the transmitted recording light L1 and shows conductivity. In FIGS. 4B and 4C, negative and positive charges generated by the recording light L1 are represented by circled −'s and +'s, respectively.

The positive charges generated in the recording photoconductive layer 2 move toward the first electrode layer 1 within the recording photoconductive layer 2 at high speed and disappear when recombined with negative charges in the first electrode layer 1 on an interface between the first electrode layer 1 and the recording photoconductive layer 2 (FIG. 4B). Meanwhile, the negative charges generated in the recording photoconductive layer 2 move within the recording photoconductive layer 2 toward the charge transfer layer 3. The charge transfer layer 3 acts as an insulator for charges (negative charges in this embodiment) of the same polarity as the charges in the first electrode layer 1. Therefore, the negative charges that have moved toward the charge transfer layer 3 within the recording photoconductive layer 2 stop at an interface between the recording photoconductive layer 2 and the charge transfer layer 3 and are accumulated concentrated along electric field distributions near the elements 5a (FIG. 4B). As a result, a static latent images corresponding to the radiation image information is recorded, taking each of the elements 5a as a center (FIG. 4C). An amount of the accumulated charges is determined based on an amount of the negative charges generated in the recording photoconductive layer 2, that is, an amount of the recording light L1 transmitted through the subject 9.

Meanwhile, since the recording light L1 is not transmitted through the light-shielding portion 9b of the subject 9, there is no change occurring in a portion below the light-shielding portion 9b of the radiation solid-state detector 10 (see FIGS. 4A to 4C).

Moreover, a major part of the recording light L1 made incident on the light-shielding member 6 provided on the first electrode layer 1 after transmitted through the transmission portion 9a of the subject 9 is absorbed by the light-shielding member 6. However, only a slight amount of the recording light L1 transmitted through the light-shielding member 6 is made incident on the recording photoconductive layer 2 similarly to the foregoing. Therefore, charges are accumulated also in a range corresponding to the correction pixel region where the foregoing light-shielding member 6 is provided.

Figure 5A:
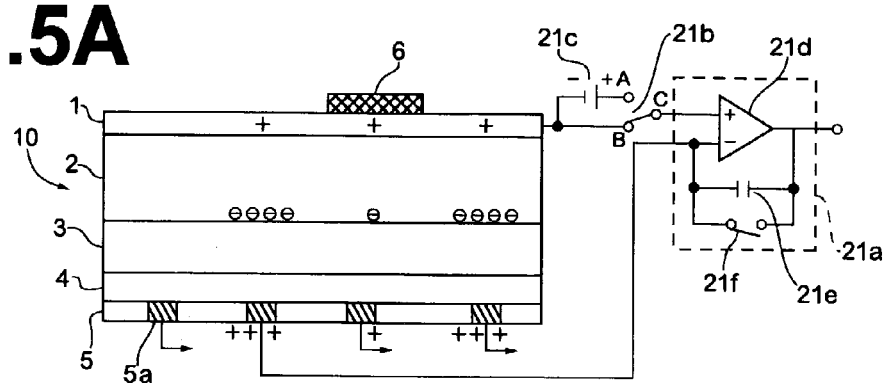
FIGS. 5A, 5B, and 5C are views explaining a method for reading the radiation image information recorded by use of the radiation image recording and reading device shown in FIG. 3A.
Figure 5B:
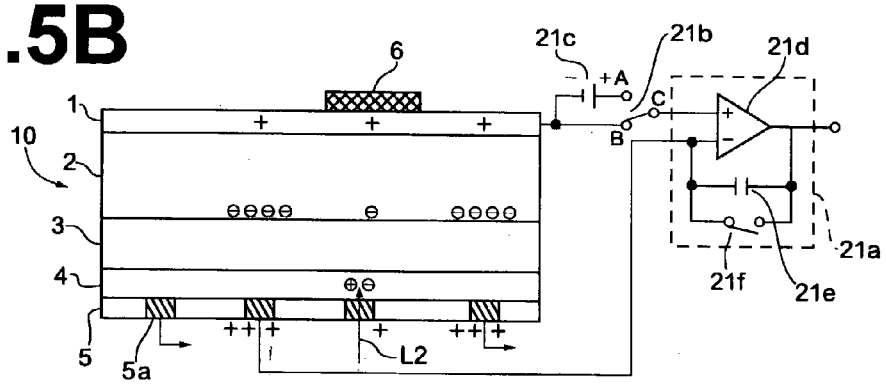
Figure 5C:
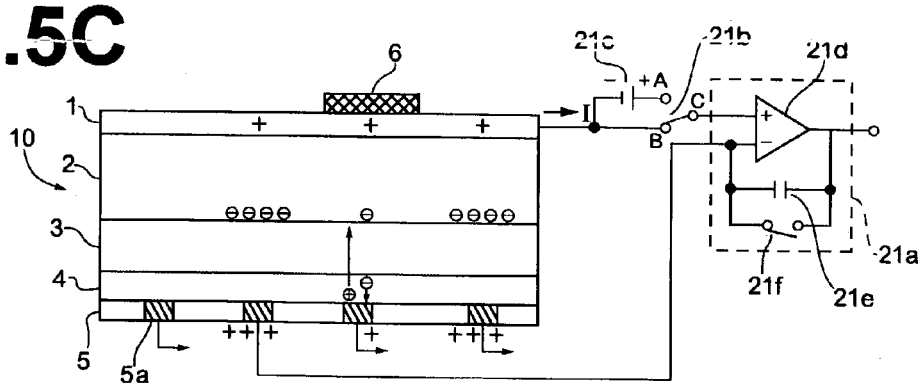

Next, in reading the radiation image information recorded as described above, first, the connection means 21b is connected to the first electrode layer 1 (B terminal) of the radiation solid-state detector 10, the first electrode layer 1 and the stripe electrodes of the second electrode layer 5 are made to have the same potential, and thus rearrangement of the charges is performed (FIG. 5A). Thereafter, upon scanning exposure of the reading light L2 by the reading light irradiation means 40, the reading light L2 is transmitted through the second electrode layer 5, positive and negative charges are generated in the reading photoconductive layer 4, which is irradiated with the reading light L2 thus transmitted, in accordance with the scanning exposure, and thus the reading photoconductive layer 4 comes to exhibit conductivity (FIG. 5B). Between an interface of the recording photoconductive layer 2 and the charge transfer layer 3 and the second electrode layer 5, an electric field is formed in accordance with the accumulated charges. Moreover, since the charge transfer layer 3 acts as a conductor for positive charges, the positive charge generated in the reading photoconductive layer 4 moves rapidly through the charge transfer layer 3 attracted to the positive charge of accumulated charges and disappears when recombined with the accumulated charge at the interface between the recording photoconductive layer 2 and the charge transfer layer 3 (FIG. 5C). On the other hand, the negative charge generated in the reading photoconductive layer 4 disappears when recombined with the positive charge of the second electrode layer 2 (FIG. 5C). In this event, a current I flows through the respective elements 5a of the second electrode layer 5 from the first electrode layer 1 of the radiation solid-state detector 10 via the current detection amplifier 21a. In each of the current detection amplifiers 21a, an integration capacitor 21e is charged by the current I, charges are accumulated in the integration capacitor 21e in accordance with an amount of the flowing current, and voltages at both ends of the integration capacitor 21e are increased. Therefore, the charges accumulated in the integration capacitor 21e are discharged by turning on the connection means 21f between the pixels in the scanning exposure, and thus changes in voltage are observed one after another at both the ends of the integration capacitor 21e, the changes corresponding to the accumulated charges of every pixel. The changes in voltage correspond to the charges of the respective pixels, which are accumulated in the radiation solid-state detector 10. Thus, by detecting the changes in voltage, the radiation image information can be read out.

Herein, signals of the respective pixels, which are read out as described above, are outputted to the correcting means 25, respectively. A memory (not shown) accumulating the foregoing signals of the respective pixels is provided in the correcting means 25, and the signals of the respective pixels are sequentially accumulated in this memory in accordance with the output from the current detection amplifier 21a. For example, it is assumed that signals outputted from the elements 5a of e1 to en in FIG. 3 are V1 to Vn, that signals of the respective pixels, which are outputted in reading of a first line, are V1—1 to Vn-1, and that signals of the respective pixels, which are outputted in reading of a second line, are V1-2 to Vn-2. Then, the signals of the respective pixels are sequentially recorded in the memory as shown in FIG. 6.

Incidentally, the correction pixel regions are provided as described above in this embodiment. Thus, for example, when the signals of the respective pixels are recorded as shown in FIG. 6, V2—2, V5-2, V2-5 and V5—5, the areas which are indicated by the shaded areas, become correction region signals corresponding to the correction pixel regions. The correcting means 25 corrects image signals corresponding to read pixels other than the correction pixel regions by use of the above correction region signals. For the correction region signals used in the correction of the image signals, those of the correction pixel regions adjacent to the foregoing read pixels are used. Therefore, when the image signals and the correction region signals are recorded as shown in FIG. 6, the image signals V1—1, V1-2, V1-3, V2-1, V2-3, V3-1, V3-2 and V3—3 are corrected by use of the correction region signal V2—2. Moreover, the image signals V1-4, V1-5, V1-6, V2-4, V2-6, V3-4, V3-5 and V3-6 are corrected by use of the correction region signal V2-5.

For a calculation method of the correction, for example, a value of the correction region signal is subtracted from a value of the image signal, the obtained value is multiplied by $\frac{3}{2}$, and the value thus obtained is the corrected image signal. This calculation method of the correction is established as follows. It is hypothesized that, when a signal component of an image signal Dn is D, a noise component is D0, a signal component of a correction region signal Dd is D' and a noise component is D0, the signal component D' of the correction region signal becomes $\frac{1}{3}$ of the image signal D. Then, the following equation (4) is established by solving the following equations (1) to (3).

$$Dd = D0 + D' \quad (1)$$

$$Dn = D0 + D \quad (2)$$

$$D' = (\tfrac{1}{3}) \times D \quad (3)$$

$$\rightarrow D = (Dn - Dd) \times \tfrac{3}{2} \quad (4)$$

As described above, for the image signals corresponding to all of the read pixels, the corrected signals can be obtained by use of the correction region signals corresponding to the correction pixel regions.

Moreover, by the correcting means 25, the image signals corresponding to the correction pixel regions may be obtained by interpolation thereof using image signals of the read pixels after the correction, which are positioned in the periphery of the image signals corresponding to the correction pixel regions.

According to the radiation image recording and reading device of the foregoing first embodiment, the correction pixel regions are provided so as to be adjacent to the read pixels, and the correcting means 25 corrects the image signals corresponding to the read pixels based on the correction region signals corresponding to the correction pixel regions adjacent to the read pixels. Thus, an offset, a gain and the like attributable to a dark current can be corrected more accurately and easily.

Moreover, when the correcting means 25 obtains the image signals corresponding to the correction pixel regions by interpolation thereof using the image signals of the read pixels after the correction, which are positioned in the periphery of the image signals corresponding to the correction pixel regions, appropriate image signals are also calculated for the correction pixel regions. Thus, deterioration of an image quality due to the provision of the correction pixel regions can be suppressed.

Figure 7A:
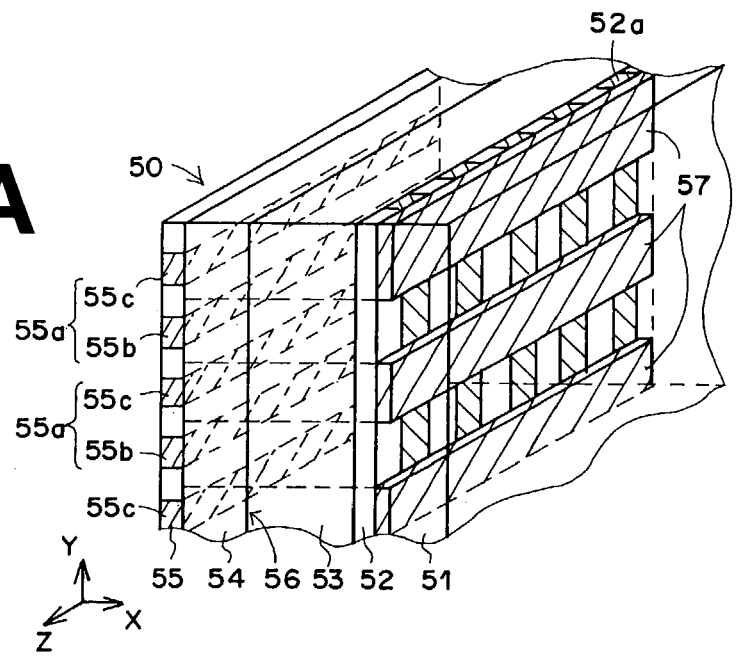
FIG. 7A is a perspective view of a radiation solid-state detector used in a radiation image recording and reading device to which a second embodiment of an image recording and reading device according to the present invention is applied.
Figure 7B:
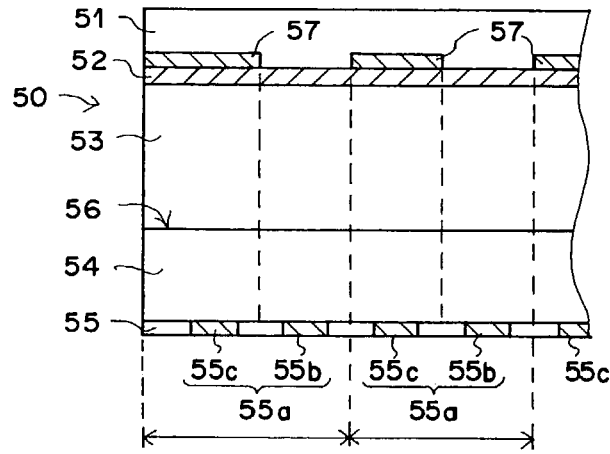
FIG. 7B is an X-Y section view of FIG. 7A.
Figure 7C:
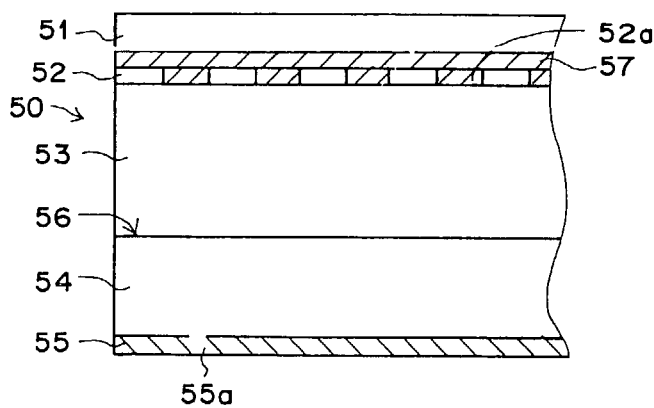
FIG. 7C is an X-Z section view of FIG. 7A.

Next, description will be made for a second embodiment of an image recording and reading device implementing an image reading method of the present invention. FIGS. 7A through 7C are views showing a schematic configuration of a radiation solid-state detector used in this embodiment. FIG. 7A is a perspective view thereof, FIG. 7B is an X-Y section view thereof and FIG. 7C is an X-Z section view thereof.

A radiation solid-state detector 50 records radiation image information as a static latent image and generates a current corresponding to the foregoing static latent image by being scanned with a reading electromagnetic wave (hereinafter referred to as a reading light). Specifically, the radiation solid-state detector 50 is constituted by sequentially laminating the following layers, including: a phosphor 51 emitting a fluorescence L4 upon excitation of a recording light L2; a first electrode layer 52 having first stripe electrodes, which are formed therein by arranging a number of tabular elements 52a in a stripe manner; a recording photoconductive layer 53 that exhibits conductivity upon receipt of irradiation of the recording light; a pre-exposure photoconductive layer 54 that exhibits conductivity upon receipt of irradiation of the reading light; and a second electrode layer 55 having second stripe electrodes, which are formed therein by arranging a number of tabular elements 55a in a stripe manner. A charge storage section 56 is formed between the recording photoconductive layer 53 and the pre-exposure photoconductive layer 54. The first electrode layer 52 allows the fluorescence L4 to be transmitted therethrough.

Herein, in this embodiment, as shown in FIG. 7B, the second electrode layer 55 is formed so as to read a region of one pixel by two of the elements 55a. The element 55b of the two elements 55a is used to read a read region signal, and the other element 55c thereof is used to read a correction region signal. On the first electrode layer 52 corresponding to correction regions read by the element 55c, light-shielding members 57 are provided. As the light-shielding member 57, it is desirable to use a member that suppresses incidence of the fluorescence L4 on the recording photoconductive layer 53 by absorbing the fluorescence. For example, a member containing Cr, a dye, a pigment or the like can be utilized.

Figure 8:
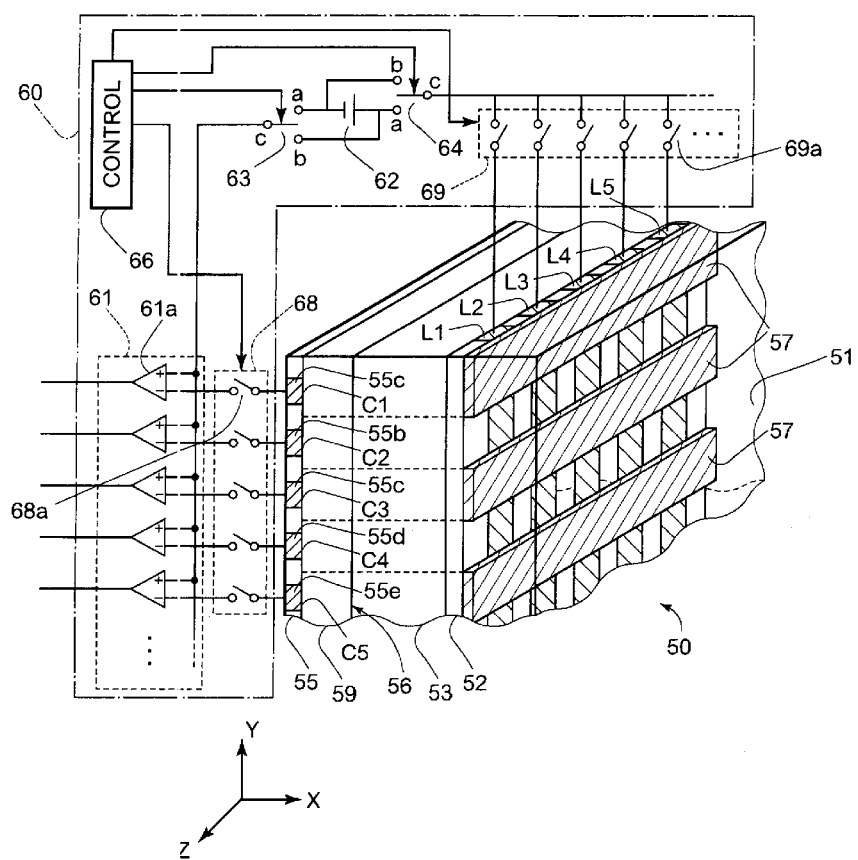
FIG. 8 is a schematic configuration view of the radiation image recording and reading device using the second embodiment of the image recording and reading device according to the present invention.
Figure 9:
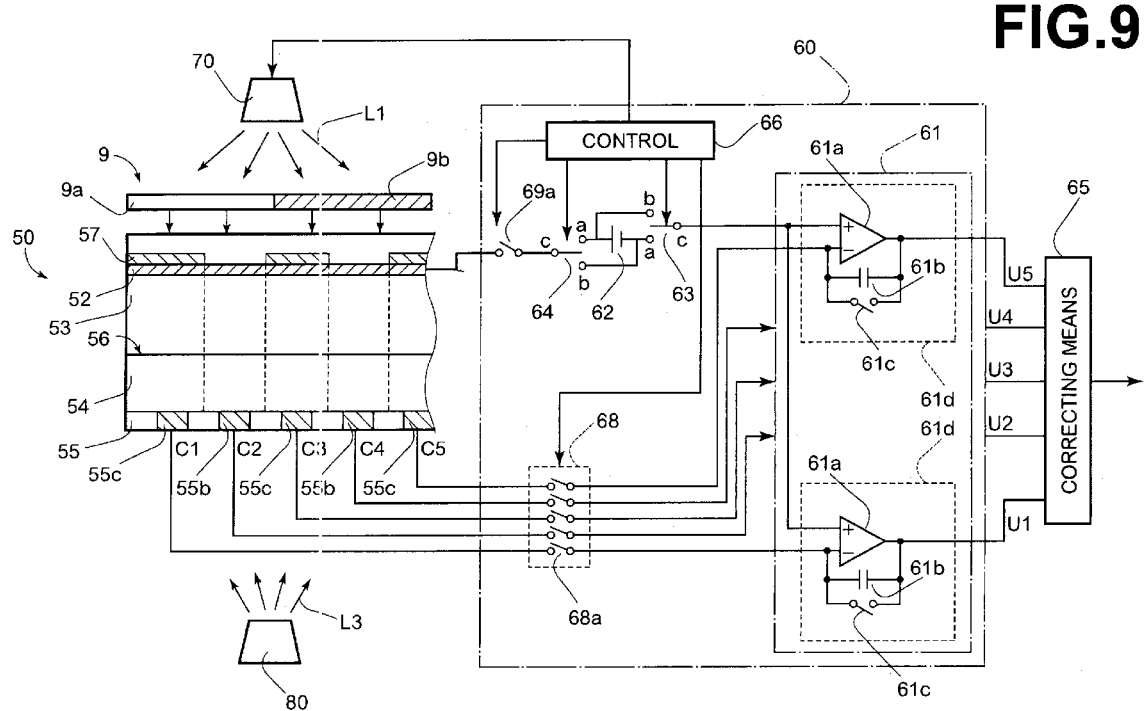
FIG. 9 is a schematic configuration view of the radiation image recording and reading device using the second embodiment of the image recording and reading device according to the present invention.

Next, description will be made in detail for a method for recording the radiation image information in the foregoing radiation solid-state detector 50 and for a method for reading the recorded radiation image information. FIGS. 8 and 9 are schematic configuration views of a radiation image recording and reading device, to which the image recording and reading device of the present invention using the radiation solid-state detector 50 shown in FIG. 7A is applied.

The radiation image recording and reading device of the present invention is constituted of: the radiation solid-state detector 50; current detection means 60; correcting means 65; recording light irradiation means 70; and reading light irradiation means 80. The recording light irradiation means 70 uniformly exposes an subject 9 to a recording light L1.

In the current detection means 60, provided are: a current detection amplifier unit 61; a power source 62; switches 63 and 64; and switch units 68 and 69.

The switch unit 69 has switching elements 69a, each of which is connected to each of the elements 52a of the first stripe electrodes. The other terminals of the respective switching elements 69a are collectively connected to a c terminal of the switch 64. The switch unit 68 has switching elements 68a, each of which is connected to each of the elements 55a of the second stripe electrodes.

The current detection amplifier unit 61 has numerous current detection amplifiers 61d. Each of the current detection amplifiers 61d is composed of an operational amplifier 61a, an integration capacitor 61b and a switch 61c. Non-inverting input terminals (+) of the respective operational amplifiers 61a are mutually connected to a c terminal of the switch 63, and inverting input terminals (−) thereof are connected to the switching elements 68a of the switch unit 68 respectively, and are connected to the elements 55a corresponding thereto, respectively, via the switching elements 68a.

A positive pole of the power source 62 is connected to a b terminal of the switch 63 and to an a terminal of the switch 64. A negative pole thereof is connected to an a terminal of the switch 63 and to a b terminal of the switch 64.

Moreover, control means 66 is provided in the current detection circuit 60. When the recording light L2 is irradiated onto the radiation solid-state detector 50 after irradiation of a pre-exposure light L3, the control means 66 first disconnects the radiation solid-state detector 50 and the power source 62 from each other by not connecting at least one of the switches 63 and 64 to any of the terminals and stops application of voltage.

Moreover, the control means 66 connects both of the switches 63 and 64 to the a terminal or the b terminal in the irradiation of the pre-exposure light L3 and allows the application of the voltage from the power source 62 to the radiation solid-state detector 50 via an imaginary short of the operational amplifier 61a. Note that a polarity of the voltage applied to the radiation solid-state detector 50 is reversed depending on whether both the switches 63 and 64 are connected to the a terminal or to the b terminal. Moreover, when required, the control means 66 allows a voltage of a reverse polarity to that in the irradiation of the pre-exposure light L3 to be applied to the radiation solid-state detector 50 after the irradiation of the pre-exposure light L3, by reversing the connections of the switches 63 and 64, for example, by changing from a state of connecting to the a terminal to a state of connecting to the b terminal.

From the control means 66, control signals are inputted to the switches 63 and 64 and the switch units 68 and 69, respectively. In reading, first, the control means 66 connects the switch 63 to the a terminal and the switch 64 to the b terminal, or connects the switch 63 to the b terminal and the switch 64 to the a terminal. Moreover, the control means 66 sequentially switches the elements 52a of the first stripe electrodes one by one in a longitudinal direction of the elements 55a, and at the same time, sequentially switches the elements 55a of the second stripe electrodes one by one in a longitudinal direction of the elements 52a so as to allow the switched elements 52a to be sequentially connected to the respective elements 55a of the second stripe electrodes via the respective switching elements 68a and the imaginary short of the operational amplifiers 61a. This sequential switching of the elements 52a in the longitudinal direction by the switch unit 68 corresponds to main scanning, and the sequential switching of the elements 55a in the longitudinal direction by the switch unit 69 corresponds to sub scanning. In FIG. 8, column numbers C1 to C5 are put to the elements 55a in the main scanning direction, and read-out line numbers L1 to L5 are put to the elements 52a in the sub-scanning direction.

Then, by connection switching of switch units 68 and 69, the current detection amplifier 61d sequentially detects discharge currents as to lattice points of the elements 52a and 55a, the discharge currents flowing out of the radiation solid-state detector 50. Thus, the current detection amplifier 61d obtains an electric signal of a level corresponding to the amount of charges accumulated in a charge storage section 56.

Next, description will be made for a method for recording radiation image information as a static latent image and further reading out the recorded static latent image after accumulating uniform charges in the charge storage section 56 by irradiating the radiation solid-state detector 50 with the pre-exposure light L3.

Figure 10A:
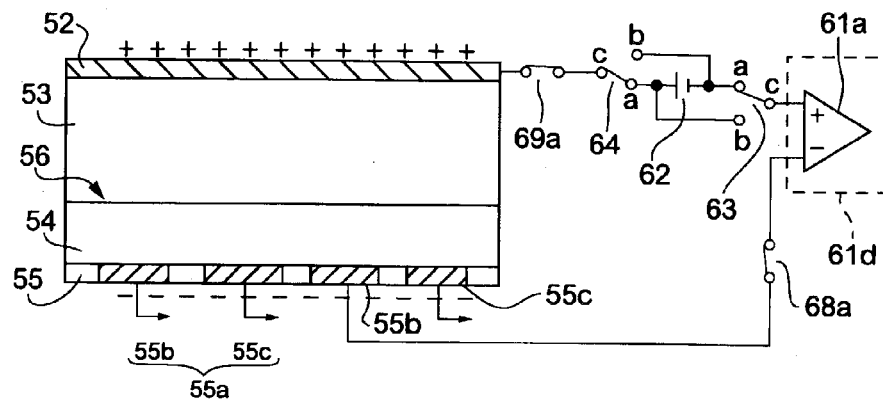
FIGS. 10A, 10B, and 10C are views explaining a method for accumulating uniform charges in the radiation solid-state detector by use of the radiation image recording and reading device shown in FIG. 8.
Figure 10B:
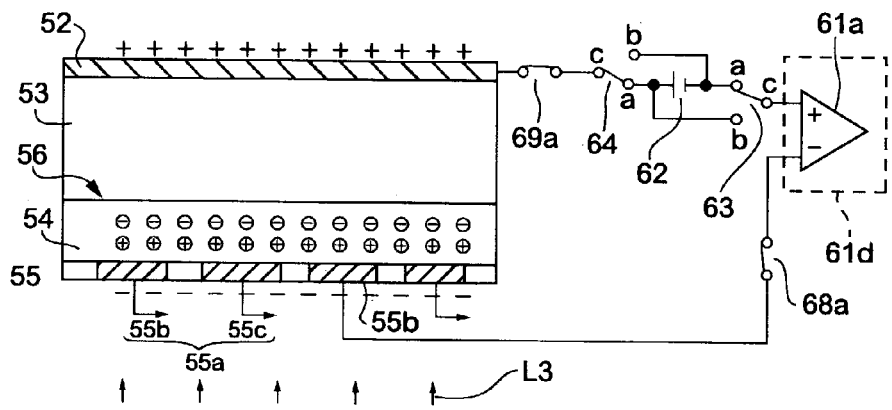
Figure 10C:
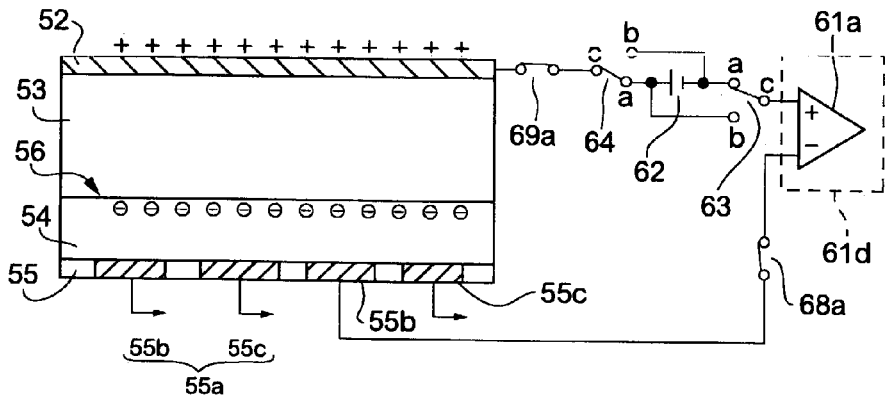

First, by referring to charge models shown in FIGS. 10A to 10C, description will be made for a uniform charge accumulation process in which uniform charges are accumulated in the charge storage section 56. Note that the phosphor 51 and the light-shielding members 57 are omitted in the drawings. Moreover, negative and positive charges generated in the pre-exposure photoconductive layer 54 by the pre-exposure light L3 are represented by circled −'s and +'s, respectively, in the drawings. Note that the light-shielding members 57 are omitted in the FIGS. 10A to 10C.

In accumulating the uniform charges in the charge storage section 56 of the radiation solid-state detector 50, first, both the switches 63 and 64 are switched to the a terminal, and all the switching elements 68a and 69a of the switch units 68 and 69 are turned on. Then, a DC voltage is applied between the first stripe electrode and the second stripe electrode from the power source 62 via the operational amplifier 61a, thus all the elements 52a of the first stripe electrode are positively charged, and all the elements 55a of the second stripe electrode are negatively charged (FIG. 10A). Accordingly, predetermined electric field distribution is generated between both the electrodes.

Next, in the state of applying the voltage between both the electrodes, the entire surface of the second electrode layer 55 is irradiated by the pre-exposure light L3 having a substantially uniform intensity from the side of second electrode layer 55. The pre-exposure light L3 is transmitted through the second electrode layer 15 of the radiation solid-state detector 50 and generates charge pairs of an amount corresponding to an amount of the pre-exposure light in the pre-exposure photoconductive layer 54, each charge pair including a positive charge and a negative charge (FIG. 10B).

Since the predetermined electric field distribution is generated between the first and second stripe electrodes, in accordance with the electric field distribution, the negative charges among the generated charge pairs move toward the charge storage section 56. Meanwhile, the positive charges among the generated charge pairs move toward the second electrode layer 55 and disappear when recombined with negative charges in the elements 55a of the second stripe electrode. By sufficient irradiation of the pre-exposure light L3, all the negative charges in the elements 55a are recombined with the positive charges generated in the pre-exposure photoconductive layer 54 and thus disappear. To be specific, the negative charges are accumulated as the uniform charges in the charge storage section 56, thus bringing about a state where the elements 52a are positively charged (FIG. 10C).

Next, by referring to charge models shown in FIGS. 11A to 11D, description will be made for a static latent image recording process for recording radiation image information as a latent image.

Figure 11A:
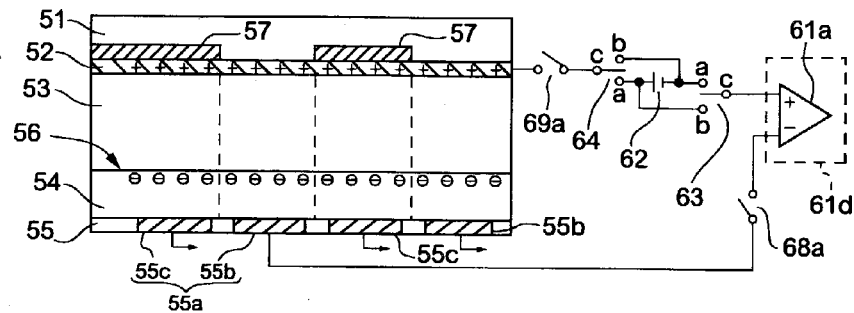
FIGS. 11A, 11B, 11C, and 11D are views explaining a method for recording radiation image information by use of the radiation image recording and reading device shown in FIG. 8.

In recording a static latent image in the radiation solid-state detector 50, first, the radiation solid-state detector 50 and the power source 62 are disconnected from each other by not connecting at least one of the switches 63 and 64 to any of the terminals, thus stopping the application of the voltage to the radiation solid-state detector 50. Note that, instead of the switches 63 and 64, it is also satisfactory that all the switching elements 69a of the switch unit 69 are turned off or that all the switching elements 68a of the switch unit 68 are turned off (FIG. 11A).

Figure 11B:
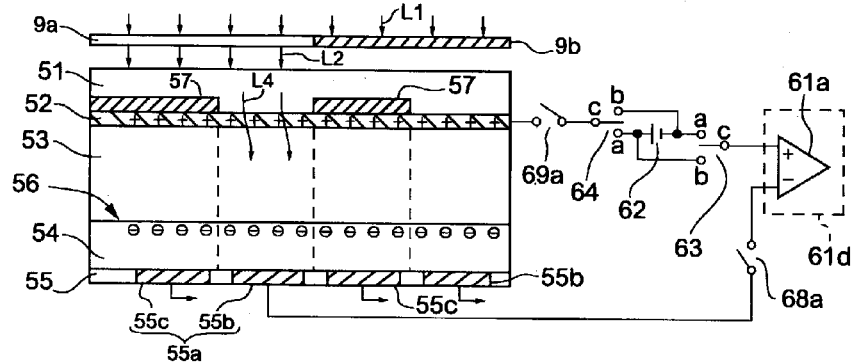

Next, the subject 9 is exposed to the radiation L1, and the recording light L2 is irradiated onto the phosphor 51 of the radiation solid-state detector 50, the recording light L2 being transmitted through the transmission portion 9a of the subject 9 and carrying radiation image information of the subject 9. Accordingly, the fluorescence L4 of an amount corresponding to a dose of the recording light L2 is emitted from the phosphor 51 upon excitation of the recording light L2 (FIG. 11B). The fluorescence L4 emitted from the phosphor 51 is transmitted through the first electrode layer 52 and generates charge pairs of an amount corresponding to the amount of the fluorescence L4 in the recording photoconductive layer 53, each charge pair including a positive charge and a negative charge (FIG. 11C).

Herein, in this embodiment, a region of one pixel is divided into a read region and a correction region, and the light-shielding member 57 is provided in the correction region as described above. Therefore, the fluorescence L4 generated in a region of the phosphor 51, the region corresponding to the correction region, is absorbed by the light-shielding member 57. Thus, only a slight amount of the fluorescence L4, which has not been absorbed by the light-shielding member 57, is made incident on the recording photoconductive layer 53, and positive and negative charge pairs corresponding to the incident fluorescence are generated.

Between the first stripe electrode and the charge storage section 56, predetermined electric field distribution is generated between positive charges in the respective elements 52a and uniform negative charges accumulated in the charge storage section 56. Therefore, in accordance with the electric field distribution, the negative charges among the generated charge pairs move toward the first electrode layer 52 and disappear when recombined with the positive charges in the elements 52a of the stripe electrode. Moreover, the positive charges among the generated charge pairs move toward the charge storage section 56 and disappear when recombined with the accumulated negative charges (the left part of FIG. 11D).

Figure 11C:
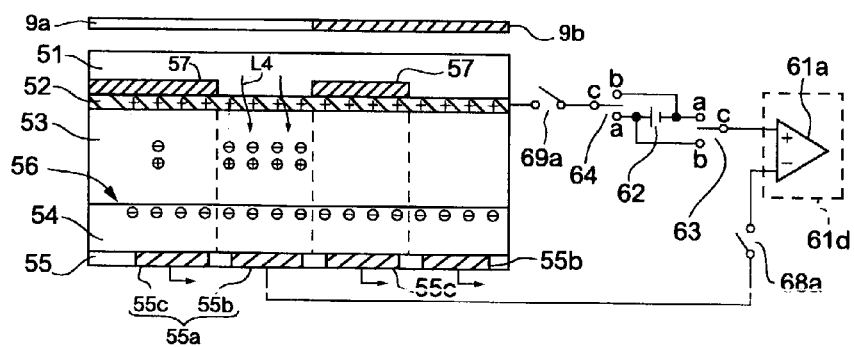
Figure 11D:
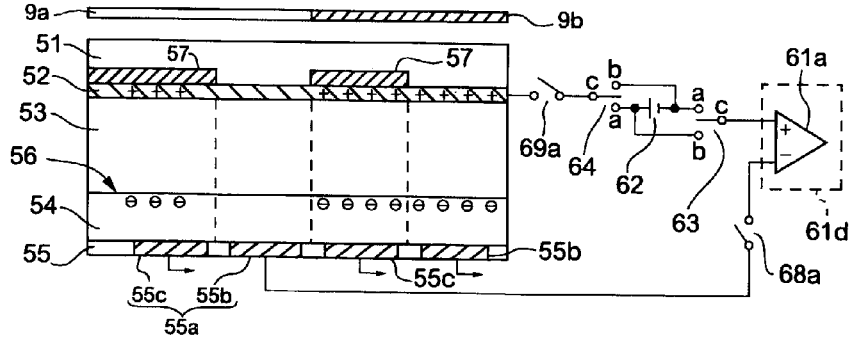

On the other hand, the radiation L1 irradiated on the non-transmissive section 9b of the subject 9 is never transmitted through the subject 9, and thus the elements 52a of the first stripe electrode, which correspond to the non-transmissive portion, are positively charged and the charge storage section 56 remains negatively charged (the right part of FIG. 11C).

Incidentally, in the above description, it is assumed that the charge pairs of the amount that allow all the charges in the elements 52a and in the charge storage section 56 to disappear are generated in the recording photoconductive layer 13. However, the amount of the charge pairs actually generated corresponds to the intensity and dose of the fluorescence L4 made incident on the radiation solid-state detector 50. Specifically, the amount of the charges that remain accumulated in the radiation solid-state detector 50 is decreased as the intensity and dose of the fluorescence L4 are increased, the fluorescence being transmitted through the subject 9 and being made incident on the radiation solid-state detector 50. Thus, charges of an amount, which is obtained by subtracting the amount of the remaining charges from the amount of the uniform charges accumulated in the charge storage section 56 by the pre-exposure, carry static latent images. In other words, the negative charges carrying the static latent images are accumulated in the charge storage section 56 as latent image charges, and the static latent images are recorded in the radiation solid-state detector 50.

Herein, in this embodiment, the region of one pixel is divided into the read region and the correction region, and the light-shielding member 57 is provided in the correction region as described above. Therefore, the negative charges carrying the static latent images are accumulated as the latent image charges in the charge storage section 56 corresponding to the read regions with no light-shielding members 57 provided therein. In the charge storage section 56 corresponding to the correction regions with the light-shielding members 57 provided therein, the negative charges corresponding to correction region signals for correcting read region signals read out from the foregoing read regions are accumulated.

Next, by referring to charge models shown in FIGS. 12A to 12C, description will be made for a static latent image reading process for reading out the static latent images recorded in the radiation solid-state detector 50 as described above.

Figure 12A:
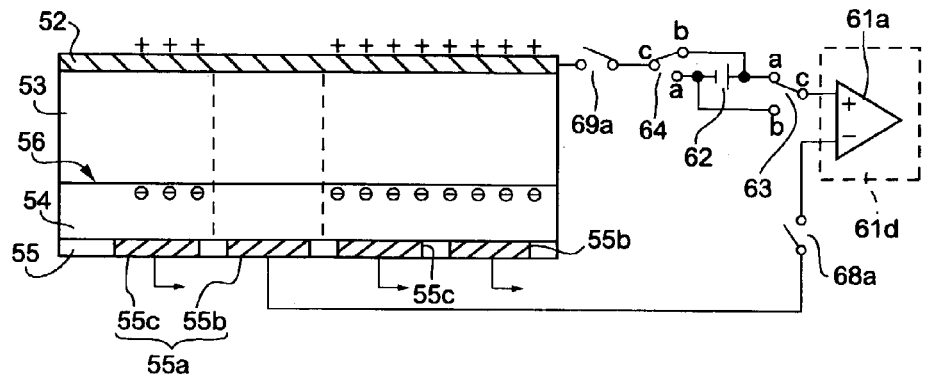
FIGS. 12A, 12B, and 12C are views explaining a method for reading the radiation image information recorded by use of the radiation image recording and reading device shown in FIG. 8.
Figure 12B:
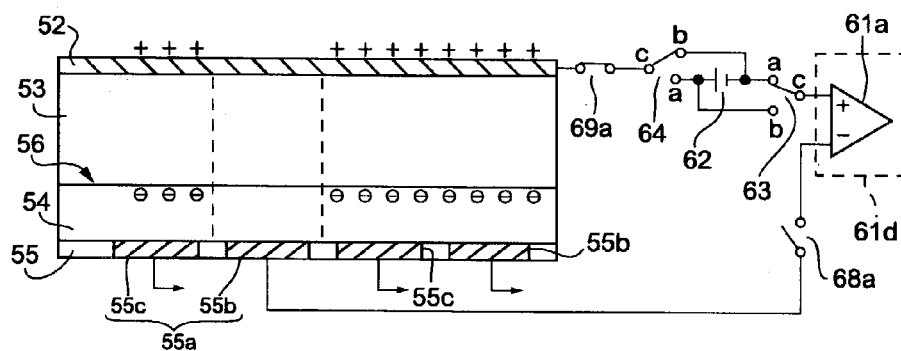
Figure 12C:
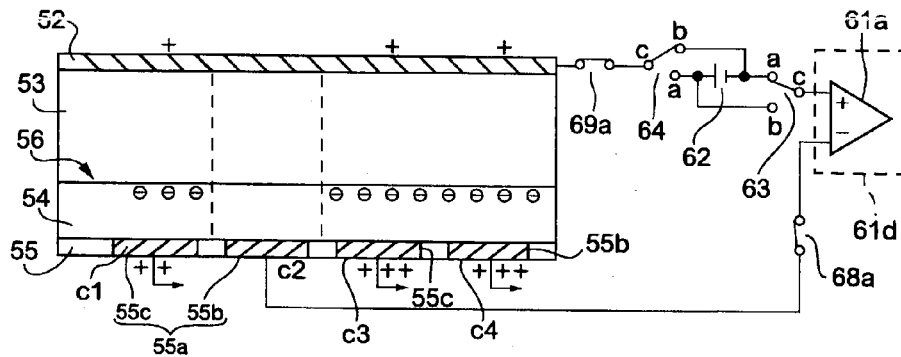

In reading the static latent images from the radiation solid-state detector 50, preparation is made so as to connect the elements 52a to the elements 55a via the imaginary short of the operational amplifier 61a when the switching elements 69a of the switch unit 69 and the switching elements 68a of the switch unit 68 are turned on by connecting the switch 63 to the a terminal and the switch 64 to the b terminal or by connecting the switch 63 to the b terminal and the switch 64 to the a terminal (FIG. 12A).

Next, the switching elements 69a only for the first line L1 are turned on among the switching elements 69a of the switch unit 69, and the switching elements 68a of the switch unit 68 are turned on one by one by sequentially switching from one end toward the other end (from column C1 toward C5) in the arranging direction of the elements 55a (the longitudinal direction of the elements 52a). Thus, the elements 55a connected to the switching elements 68a turned on are sequentially connected to the elements 52a for the first line L1 via the operational amplifier 61a (FIG. 12B). This sequential connection corresponds to the main scanning in the first line L1.

This connection switching allows the elements 52a and each element 55a to have the same potential sequentially. Then, the charge rearrangement is performed between the negative charges accumulated in portions corresponding to the elements 52a for the first line L1 and to connected elements 55a which have been turned on by switching part 68a, that is, the lattice points of element 52a and 55a. Specifically, the positive charges in the connected elements 52a move toward the second electrode layer 55 via the operational amplifier 61a, and the positive charges are redistributed in accordance with respective sizes of a capacity Ca in the corresponding portion between the charge storage section 56 and the elements 52a and a capacity Cb between the charge storage section 56 and the elements 55a. On the other hand, in a portion where no negative charge exists in the charge storage section 56, there is no movement of the positive charges.

Each current detection amplifier 61d of the current detection amplifier unit 61 sequentially detects changes in voltage of an output unit of the current detection amplifier 61d for each of the elements 55a, the voltage changing in response to the discharge current Id flowing out from the radiation solid-state detector 50 upon the movement of the positive charges. This change in voltage corresponds to an amount of latent image charges for each pixel, which are accumulated in the radiation solid-state detector 50. Thus, the sequential switching of the switch unit 68 allows the change in voltage corresponding to the latent image charges for each pixel one after another in the main scanning direction, to be observed. As a result, image signals for the first line L1 can be obtained.

Figure 13:
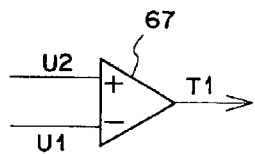
FIG. 13 is a view showing a difference amplifier in correcting means of the radiation image recording and reading device shown in FIG. 8.

Herein, in this embodiment, the read region signal corresponding to the read region in the region of one pixel is read out from the element 55b of the second stripe electrode, and the correction region signal corresponding to the correction region is read out from the element 55c of the second stripe electrode. The read region signal read out from the element 55b and the correction region signal read out from the element 55c are detected by the current detection amplifier, respectively, and voltage changes of the respective signals are inputted to the correcting means 65. For example, in FIG. 9, the signal read out from the column C1 is inputted as the correction region signal U1 to the correcting means 65, and the signal read out from the column C2 is inputted as the read region signal U2 to the correcting means 65. The correcting means 65 include difference amplifiers 67 as shown in FIG. 13, which are equivalent to the number of the pixels in the main scanning direction in the radiation solid-state detector 50. The correction region signal U1 and the read region signal U2 are inputted to this difference amplifier, and a difference between the two signals is calculated in the difference amplifier. After multiplying the difference by a predetermined gain, the resultant product is outputted as an image signal T1. All of the signals outputted from the elements 55b and 55c of the radiation solid-state detector 50 are corrected by the correcting means 65 as described above and outputted as the image signals. For the foregoing predetermined gain, for example, in the case where the read region signal and the correction region signal are in the relationship as that established by the equations (1) to (3) in the first embodiment, a gain may be set so as to multiply the foregoing difference by ⅔.

Hereinafter, processes are performed in the following order. Specifically, the switching elements 69a only for a desired read-out line are turned on by sequentially switching the switching elements 69a of the switch unit 69 in the longitudinal direction of the elements 55a, for example, by turning on only the switching elements 69a connected to the element 52a of the second line L2 and turning off the respective switching elements 69a connected to the elements 52a of the other read-out lines L1, L3, L4 and the like, and the current detection for the relevant read-out line is performed by sequentially switching the switching elements 68a of the switch unit 68 similarly to the operation for the foregoing first line L1. Thus, a correction region signal and a read region signal for each pixel in the relevant read-out line are obtained, and an image signal is obtained by correcting the two signals with the correcting means 65, and thus image signals representing one static latent image are obtained by performing calculation of the image signals for all the lines in the sub-scanning direction. In other words, radiation image information can be read.

According to the radiation image recording and reading device of the foregoing second embodiment, each of the pixels in the radiation solid-state detector 50 is divided into the correction region and the read region other than the correction region, the image signal is generated from the read region signal read from the read region, and the generated image signal is corrected by use of the correction region signal read from the correction region located in the same pixel as the read region. Thus, the offset, gain and the like attributable to the dark current can be corrected more accurately and easily.

Figure 14:
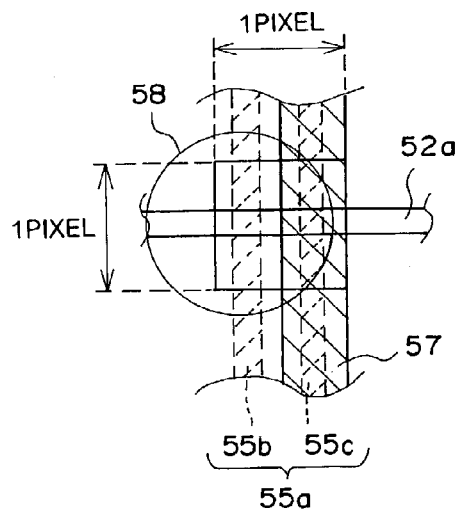
FIG. 14 is a view showing a mode of providing a condenser in the radiation image recording and reading device shown in FIG. 8.

Moreover, in the foregoing second embodiment, as shown in FIG. 14, a lens 58 may be provided so as to focus the recording light to be irradiated on the read region in the radiation solid-state detector 50. When the recording light is focused by the lens 58 as described above, the deterioration in the image quality due to the provision of the correction regions can be suppressed.

Figure 15:
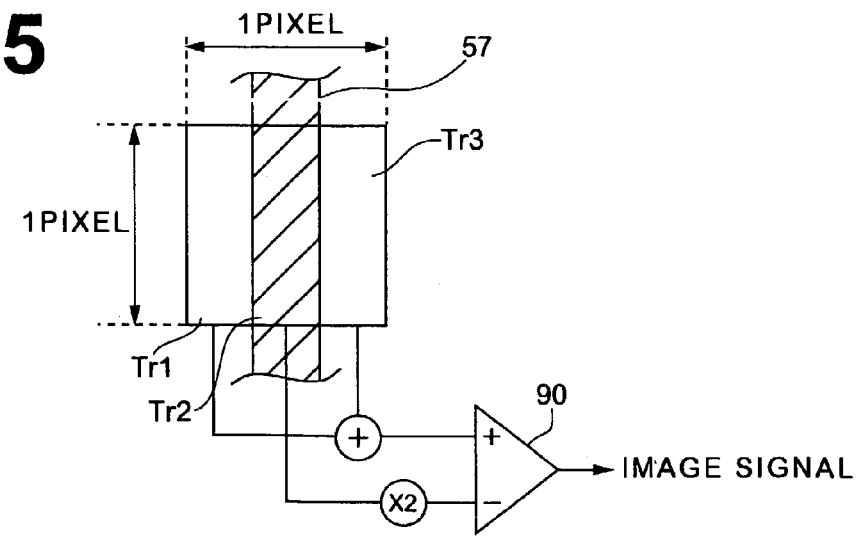
FIG. 15 is a schematic configuration view partially showing a radiation image recording and reading device using another embodiment of the image recording and reading device of the present invention.

Moreover, in the foregoing second embodiment, the latent image charges are read out by the stripe electrode. However, in the case of a mode in which the latent image charges are read out by a TFT, for example, by use of an exposure mask used in preparing a color liquid crystal panel, three transistors Tr1, Tr2 and Tr3 are constituted in a region of one pixel as shown in FIG. 15. Then, Tr1 and Tr3 among the three transistors may be utilized for reading out a read region signal, and Tr2 may be utilized for reading out a correction region signal. In such a case, in a mode of detecting the recording light carrying the radiation image information by use of a photodiode, the light-shielding member 57 may be provided so as to suppress incidence of the recording light on the photodiode corresponding to the region read out by Tr2. Moreover, in a mode of detecting the recording light carrying the radiation image information by use of a photoconductive layer, the light-shielding member 57 may be provided so as to suppress incidence of the recording light on the photoconductive layer corresponding to the region read out by Tr2.

Furthermore, when Tr1 and Tr2 are set as transistors for read region signal readout and Tr3 is set as transistor for correction region signal readout, or when Tr2 and Tr3 are set as the transistors for read region signal readout and Tr1 is set as the transistor for correction region signal readout, similarly to the mode shown in FIG. 14, the lens may be provided so as to focus the recording light in the photodiode or the photoconductive layer, which correspond to the region read out by the transistors for read region signal readout.

Moreover, when the signal of one pixel is read out by the three transistors as described above, the correction may be performed as follows. Specifically, as shown in FIG. 15, the signal obtained by adding signals read out by the two transistors for a read region signal reading is inputted as a read region signal to a difference amplifier 90, and meanwhile, the signal obtained by doubling a signal read out by the one transistor for correction region signal reading is inputted as a correction region signal to the difference amplifier 90. Thus, an image signal is obtained by subtracting the correction region signal from the foregoing read region signal. Furthermore, a predetermined gain may be set in the foregoing difference amplifier.

Figure 16:
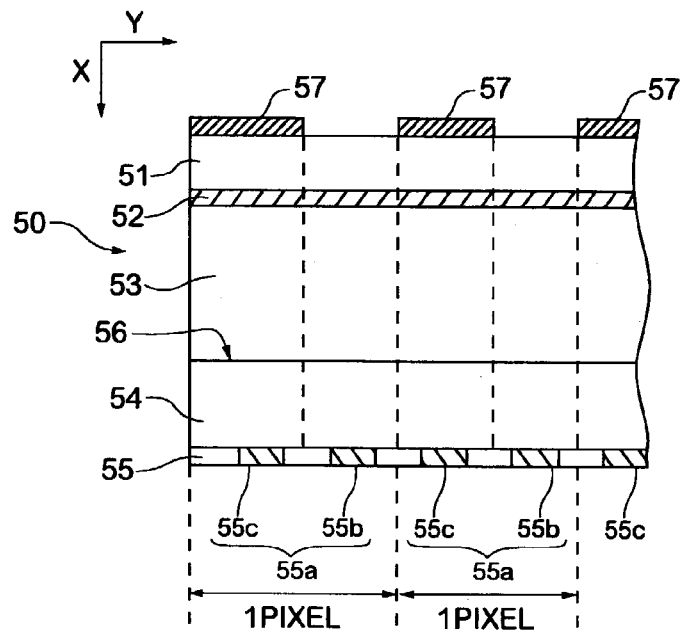
FIG. 16 is a schematic configuration view partially showing a radiation image recording and reading device using another embodiment of the image recording and reading device of the present invention.

In the foregoing second embodiment, the light-shielding members 57 are provided in the phosphor 51. However, the light-shielding members 57 may be provided on the phosphor 51 as shown in FIG. 16.

Figure 17:
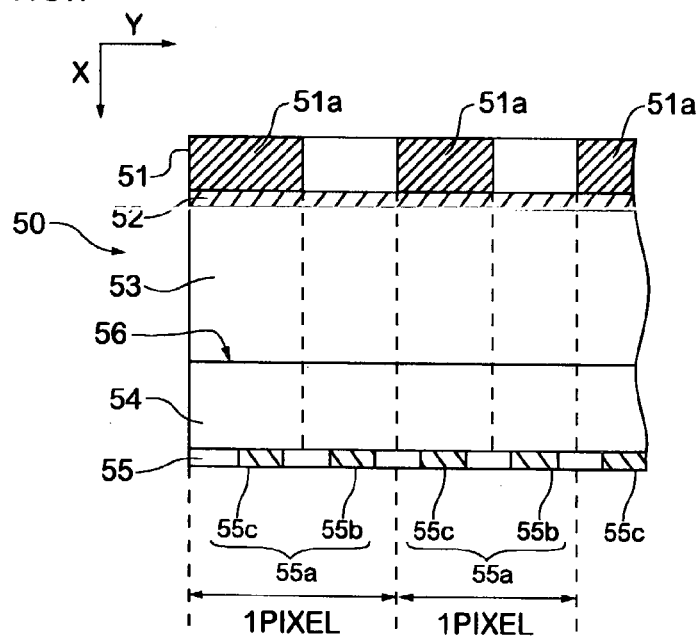
FIG. 17 is a schematic configuration view partially showing a radiation image recording and reading device using another embodiment of the image recording and reading device of the present invention.

Moreover, as shown in FIG. 17, it is also satisfactory that, all of regions 51a in the phosphor 51, which correspond to the correction regions, contain dyes or pigments, for example, to absorb the fluorescence irradiated on the radiation solid-state detector 50, thus suppressing the fluorescence made incident on the recording photoconductive layer 53.

Figure 18:
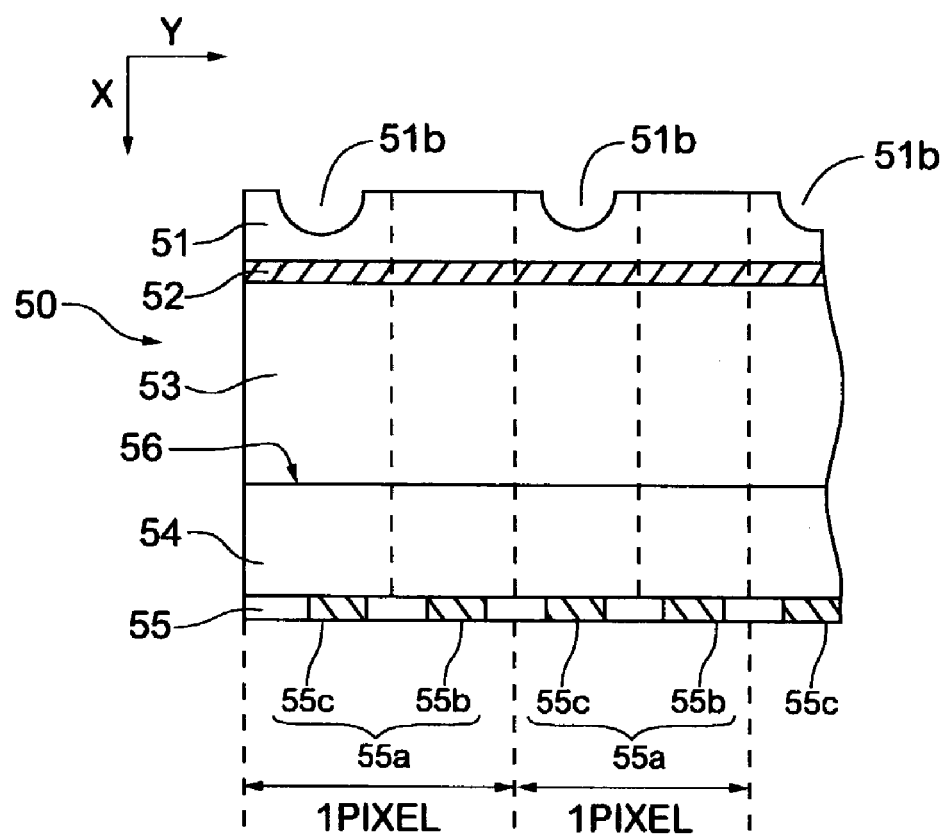
FIG. 18 is a schematic configuration view partially showing a radiation image recording and reading device using another embodiment of the image recording and reading device of the present invention.

Moreover, as shown in FIG. 18, it is also satisfactory that holes 51b are provided in regions in the phosphor 51, which correspond to the correction regions, to decrease the fluorescence generated in the phosphor 51, thus suppressing the fluorescence made incident on the recording photoconductive layer 53.

What is claimed is:

1. An image reading method in which a solid-state detector for recording image information by accumulating charges generated by irradiation of a recording electromagnetic wave carrying the image information is used, an image signal corresponding to the image information is read for every pixel from the solid-state detector with the image information recorded therein by the irradiation of the recording electromagnetic wave, and the image signal is corrected based on a correction region signal read from a correction region where the incidence of the recording electromagnetic wave in the solid-state detector is suppressed,
   wherein the correction region is set as a correction pixel region formed in units of pixels,
   a plurality of the correction pixel regions are provided so as to be dispersed and distributed in an area where the recording electromagnetic wave is irradiated, and
   each image signal read from a read pixel positioned in a region other than the correction pixel regions is corrected based on a correction signal read from a correction pixel adjacent to the read pixel, and each correction pixel is used to correct a plurality of read pixels.

2. The image reading method of claim 1, wherein each correction pixel is used to correct all read pixels adjacent to the correction pixel, and only one correction pixel is used to correct each read pixel.

3. An image reading method in which a solid-state detector for recording image information by accumulating charges generated by irradiation of a recording electromagnetic wave carrying the image information is used, an image signal corresponding to the image information is read for every pixel from the solid-state detector with the image information recorded therein by the irradiation of the recording electromagnetic wave, and the image signal is corrected based on a correction region signal read from a correction region where the incidence of the recording electromagnetic wave in the solid-state detector is suppressed,
   wherein the pixel in the solid-state detector is divided into the correction region and a read region other than the correction region,
   the image signal is generated from a read region signal read from the read region, and
   the generated image signal is corrected by use of a correction region signal read from a correction region located in the same pixel as that of the read region.

4. The image reading method of claim 3, wherein a condensing lens condenses the recording electromagnetic wave in the read region of the pixel.

5. An image recording and reading device, comprising:
   a solid-state detector for recording image information by accumulating charges generated by irradiation of a recording electromagnetic wave carrying the image information is used;
   a reading means for reading an image signal for every pixel, the image signal corresponding to the image information recorded in the solid-state detector, and for reading a correction region signal from a correction region where the incidence of the recording electromagnetic wave in the solid-state detector is suppressed; and
   a correcting means for correcting the image signal based on the correction region signal, wherein
   the correction region is a correction pixel region formed in units of pixels, and a plurality of the correction pixel regions are provided so as to be dispersed and distributed in an area where the recording electromagnetic wave is irradiated, and
   the correcting means corrects respective image signals read from read pixels positioned in a region other than the correction pixel regions based on a correction signal read from a correction pixel adjacent to the read pixel, and each correction pixel is used to correct a plurality of read pixels.

6. The image recording and reading device of claim 5, wherein each correction pixel is used to correct all read pixels adjacent to the correction pixel, and only one correction pixel is used to correct each read pixel.

7. An image recording and reading device, comprising:
   a solid-state detector for recording image information by accumulating charges generated by irradiation of a recording electromagnetic wave carrying the image information is used;
   a reading means for reading an image signal for every pixel, the image signal corresponding to the image information recorded in the solid-state detector, and for reading a correction region signal from a correction region where the incidence of the recording electromagnetic wave in the solid-state detector is suppressed; and
   a correcting means for correcting the image signal based on the correction region signal,
   wherein the pixel in the solid-state detector is divided into the correction region and a read region other than the correction region,
   the reading means generates an image signal from a read region signal read from the read region, and
   the correcting means corrects the generated image signal by use of the correction region signal read from the correction region located in the same pixel as that of the read region.

8. The image recording and reading device of claim 7, wherein a condensing lens condenses the recording electromagnetic wave in the read region of the pixel.

9. An image recording and reading device, comprising:
   a solid-state detector for recording image information by accumulating charges generated by irradiation of a recording electromagnetic wave carrying the image information, in which a plurality of correction pixel regions provided so as to be dispersed and distributed in an area where the recording electromagnetic wave is irradiated and read pixel regions provided in regions other than the correction pixel regions are two-dimensionally arranged in pixel units, the correction pixel regions having incidence of the recording electromagnetic wave thereto suppressed;
   a reading means for reading charges generated in the correction pixel region of the solid-state detector as a correction pixel signal and for reading charges generated in the read pixel region thereof as a read pixel signal; and
   a correcting means for correcting the read pixel signal read by the reading means by use of a correction pixel signal corresponding to a correction pixel region adjacent to a read pixel region corresponding to the read pixel signal, wherein each correction pixel signal is used to correct a plurality of read pixels, and for outputting the corrected read pixel signal as an image signal corresponding to the image information.

10. The image recording and reading device of claim 9, wherein the correction pixel regions are constituted by providing light-shielding members in the area where the recording electromagnetic wave is irradiated.

11. The image recording and reading device of claim 9, wherein the solid-state detector has a phosphor layer that emits fluorescence upon irradiation of the recording electromagnetic wave and generates charges in accordance with the fluorescence emitted from the phosphor layer, and the correction pixel region is made by allowing the phosphor layer to be formed with a pigment or a dye that absorbs fluorescence.

12. The image recording and reading device of claim 9, wherein the reading means is composed of:

a linearly extending light source;

a scanning mechanism for scanning the line light source in a direction substantially orthogonal to a longitudinal direction of the line light source; and a stripe electrode composed of a plurality of linear electrodes extending linearly, which are arranged in the longitudinal direction for every pixel and which takes the charges generated in the correction pixel region as the correction pixel signal and the charges generated in the read pixel region as the read pixel signal when the line light source is scanned in the direction substantially orthogonal to the longitudinal direction thereof by the scanning mechanism.

13. The image recording and reading device of claim 9, wherein the reading means is composed of:

a first stripe electrode having a plurality of first linear electrodes extending linearly, which are arranged for each pixel in a direction substantially orthogonal to a longitudinal direction of the linear electrodes;

a second stripe electrode having a plurality of second linear electrodes extending linearly, which are arranged for each pixel in the longitudinal direction, the second stripe electrode being provided opposite to the first stripe electrode so as to sandwich the solid-state detector therebetween; and a signal detection amplifier for reading the read pixel signal and the correction pixel signal by connecting the first and second linear electrodes to each other.

14. The image recording and reading device of claim 9, wherein the reading means is composed of:

TFT switches provided for each pixel, for taking the charges generated in the correction pixel region as the correction pixel signal and the charges generated in the read pixel region as the read pixel signal; and a control unit for controlling the TFT switches.

15. The image recording and reading device of claim 9, wherein the correcting means performs the correction of the read pixel signal by calculating the following equation:

$D=(Dn-Dd)\times 3/2$, where

D: image signal,
Dn: read pixel signal, and
Dd: correction pixel signal.

16. The image recording and reading device of claim 9, wherein each correction pixel is used to correct all read pixels adjacent to the correction pixel, and only one correction pixel is used to correct each read pixel.

17. An image recording and reading device, comprising:

a solid-state detector for recording image information by accumulating charges generated by irradiation of a recording electromagnetic wave carrying the image information, in which pixels are arranged two-dimensionally, each of which is composed of a correction pixel region and a read pixel region other than the correction pixel region, the correction pixel region having incidence of the recording electromagnetic wave thereto suppressed;

a reading means for reading charges generated in the correction pixel region as a correction pixel signal and for reading charges generated in the read pixel region as a read pixel signal; and a correcting means for correcting the read pixel signal by use of a correction pixel signal corresponding to a correction pixel region located in the vicinity of a read pixel region corresponding to the read pixel signal and for outputting the corrected read pixel signal as an image signal corresponding to the image information.

18. The image recording and reading device of claim 17, wherein the correction pixel regions are made up by being provided with light-shielding members in an area where the recording electromagnetic wave is irradiated.

19. The image recording and reading device of claim 17, wherein the solid-state detector has a phosphor layer that emits fluorescence upon irradiation of the recording electromagnetic wave and generates charges in accordance with the fluorescence emitted from the phosphor layer, and the correction pixel region is made by allowing the phosphor layer to be formed with a pigment or a dye that absorbs fluorescence.

20. The image recording and reading device of claim 17, wherein the reading means is composed of:

a linearly extending light source;

a scanning mechanism for scanning the line light source in a direction substantially orthogonal to a longitudinal direction of the line light source; and a stripe electrode composed of a plurality of linear electrodes extending linearly, which are arranged in the longitudinal direction and takes the charges generated in the correction pixel region as the correction pixel signal and the charges generated in the read pixel region as the read pixel signal when the line light source is scanned in the direction substantially orthogonal to the longitudinal direction thereof by the scanning mechanism.

21. The image recording and reading device of claim 17, wherein the reading means is composed of:

TFT switches provided for every correction pixel region and read pixel region, for taking the charges generated in the correction pixel region as the correction pixel signal and the charges generated in the read pixel region as the read pixel signal; and a control unit for controlling the TFT switches.

22. The image recording and reading device of claim 17, wherein the correction pixel regions are provided linearly for every column of pixels, and the reading means is composed of:

a first stripe electrode having a plurality of first linear electrodes extending linearly, which are arranged for each pixel in a direction substantially orthogonal to a longitudinal direction of the linear electrodes;

a second stripe electrode having a plurality of second linear electrodes extending linearly, which are arranged for every correction pixel region and read pixel region in the longitudinal direction, the second stripe electrode being provided opposite to the first stripe electrode so as to sandwich the solid-state detector therebetween; and a signal detection amplifier for reading the read pixel signal and the correction pixel signal by connecting the first and second linear electrodes to each other.

23. The image recording and reading device of claim 17, wherein the correcting means is composed of a difference amplifier for outputting the image signal based on the difference between a correction pixel signal and a read pixel signal, which are outputted from the signal detection amplifier.

24. The image recording and reading device of claim 17, wherein the correcting means performs the correction of the read pixel signal by calculating the following equation:

$$D=(Dn-Dd)\times 3/2, \text{ where}$$

D: image signal,
Dn: read pixel signal, and
Dd: correction pixel signal.

25. The image recording and reading device of claim 17, wherein a condensing lens condenses the recording electromagnetic wave in the read region of the pixel.

* * * * *